(12) United States Patent
Matsubara et al.

(10) Patent No.: US 6,372,628 B1
(45) Date of Patent: Apr. 16, 2002

(54) INSULATING FILM COMPRISING AMORPHOUS CARBON FLUORIDE, A SEMICONDUCTOR DEVICE COMPRISING SUCH AN INSULATING FILM, AND A METHOD FOR MANUFACTURING THE SEMICONDUCTOR DEVICE

(75) Inventors: Yoshihisa Matsubara; Ko Noguchi; Shinya Ito; Noriaki Oda; Akira Matsumoto; Takashi Ishigami; Masahiko Nakamae; Tadahiko Horiuchi; Kazuhiko Endo; Toru Tatsumi; Yoshishige Matsumoto, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/579,474

(22) Filed: May 26, 2000

Related U.S. Application Data

(62) Division of application No. 08/982,585, filed on Dec. 2, 1997, now Pat. No. 6,091,081.

(30) Foreign Application Priority Data

Dec. 2, 1996 (JP) ............................................. 8-321694
Jun. 5, 1997 (JP) ............................................. 9-148017

(51) Int. Cl.[7] ......................................... H01L 21/4763
(52) U.S. Cl. ....................................... 438/622; 438/758
(58) Field of Search ................................ 438/482, 483, 438/622, 680, 692, 723, 724, 769, 787, 757, 756, 791, 954, 475, 697, 743, 744, 758, 766

(56) References Cited

U.S. PATENT DOCUMENTS 5,866,920 A * 2/1999 Matsubara et al. ............ 257/63
5,985,750 A * 11/1999 Oda ........................... 438/623
6,104,092 A * 8/2000 Matsubara et al. .......... 257/764

FOREIGN PATENT DOCUMENTS

| EP | 0 696 819 A1 | 2/1996 |
| EP | 0 701 283 A2 | 3/1996 |
| JP | 5-74962 | 3/1993 |
| JP | 8-838842 | 3/1996 |
| JP | 8-222557 | 8/1996 |
| JP | 8/236517 | 9/1996 |
| JP | 9-246242 | 9/1997 |

* cited by examiner

*Primary Examiner*—David Nelms
*Assistant Examiner*—David Nhu
(74) *Attorney, Agent, or Firm*—Sughrue Mion, PLLC

(57) ABSTRACT

A structure and manufacturing process of a low dielectric constant interlayer insulating film used between wiring layers and semiconductor devices using such film are disclosed. The insulating film which can withstand in an actual process comprises an amorphous carbon fluoride film. A diamond like carbon film and a silicon excess layer are disposed on both sides of the amorphous carbon fluoride film to be inserted between the wiring layers, whereby adhesion to wiring and another insulating film contacting it is significantly enhanced. In addition, a silicon based insulating film is disposed and flattened on a multilayer film containing an amorphous carbon fluoride film buried with a wiring layer, and is used as a hard mask for anisotropically etching the diamond like carbon film and the amorphous carbon fluoride film with oxygen plasma to form a via hole.

3 Claims, 23 Drawing Sheets

INSULATING FILM COMPRISING AMORPHOUS CARBON FLUORIDE, A SEMICONDUCTOR DEVICE COMPRISING SUCH AN INSULATING FILM, AND A METHOD FOR MANUFACTURING THE SEMICONDUCTOR DEVICE

This is a Divisional of application Ser. No. 08/982,585 filed Dec. 2, 1997, the disclosure of which is incorporated herein by reference now U.S. Pat. No. 6,091,081.

BACKGROUND OF THE INVENTION

1. Field of the Invention

The present invention relates to a semiconductor device having a plurality of laminated wiring layers, or multilayer wiring layers separated by insulating layers, and such an insulating film, as well as a manufacturing process for such a semiconductor device.

2. Description of the Related Art

As integration becomes more and more dense for a semiconductor large-scale integrated circuit (LSI), individual devices with dimensional accuracy of ¼ μm or less are now integrated near the surface of a Si substrate. An LSI exhibits its function only after its individual devices are connected by wiring. However, if wiring is detoured to avoid intersections in interconnections between the individual devices, interconnecting delay may be caused because area occupied by wiring or wiring length is increased. A technique has been commonly used for providing wiring on multiple layers by inserting insulating layers between wiring to prevent intersections and/or overlapping of wiring.

This concept of multilayer wiring is shown in FIG. 16. An insulating film 1631 is formed in a silicon substrate 161, and is formed with a contact hole 164 therein. A contact plug 164 is buried in the contact hole 164 to connect a device forming region 162 to a first wiring layer 1651. In addition, the first wiring layer 1651 is connected to a second wiring layer 1652 through a via plug 1661 filled in a via hole 1661 opened in the insulating film 1632. The second wiring layer 1652 is connected to a third wiring layer 1653 through a via plug 1662 filled in a via hole 1662 opened in the insulating film 1633. Further multilayer wiring can be attained by sequentially repeating the process described above. The process is completed by covering the last wiring layer with a sealing film 167.

This technique for multilayer wiring with thin insulating layers therebetween has a large stray capacity causing interconnecting delay. When a signal containing high frequency components is transmitted through two vertically adjacent wiring layers having an inter-layer insulating film therebetween, crosstalk is generated, thereby causing erroneous operation. To prevent interconnecting delay or crosstalk, it is sufficient to increase the distance between the upper and lower wiring, or to thicken the inter-layer insulating film. However, thickening the inter-layer insulating film makes it necessary to form a deep, contact hole or via hole. Formation of a deep contact hole or via hole makes it further difficult to perform the dry etching technology for forming these holes. Thus, it is desirable to have the thinnest inter-layer insulating film as possible. The semiconductor integrated circuit technology for 256 megabit DRAM (Dynamic Random Access Memory) or thereafter requires a smaller contact hole diameter of ¼ μm or less. However, if it is desired to hold a ratio of the depth of a contact hole to its diameter, or an aspect ratio, up to five from the viewpoint of the dry etching technology, the thickness of the inter-layer insulating film is necessarily required to be 1 μm or less. While the problem on the stray capacity between the upper and lower wiring layers is addressed in the above, an increase of stray capacity is also serious between wiring formed on a same plane. It is because, as the semiconductor integrated circuit is miniaturized, thickness of wiring and distance between wiring are also miniaturized, necessarily leading to the same problem as in the wiring thickness of ¼ μm. Since the wiring spacing cannot be widened in view of the requirement for a high degree of integration, the problem on interconnecting delay or crosstalk is more serious between wiring disposed on the same layer than between the upper and lower wiring for which the inter-layer insulating film may potentially be thickened.

To accurately determine interconnecting delay and crosstalk accompanying an increase of inter-wiring capacity determined by the thickness of the upper and lower inter-layer insulating film or the inter-layer insulating film in the same plane, it is necessary to handle it as a distributed constant circuit. FIG. 14 shows the capacity per unit wiring length between a wiring layer insulated by a silicon oxide film with a thickness H (dielectric constant: 3.9) and wiring on a silicon substrate, which is described by L. M. Dang, et al. in "IEEE Electron Device Letters," Vol. EDL-2, 1981, p. 196. It shows that, as wiring width W decreases, capacity C significantly increases by a so-called fringe effect when compared with the so-called plane parallel plate approximated capacity. It is also known that the higher wiring height T is, the larger capacity C is. Although the insulating film between the silicon substrate and the lowermost wiring as shown in FIG. 14 is not usually called an inter-layer insulating film, it is common in the problems of interconnecting delay and crosstalk. Thus, the inter-layer insulating film referred to in this specification includes an insulating film contacting the silicon substrate and performing electric insulation with the wiring as well. In addition, FIG. 15 described in the above-referenced paper shows that, as wiring spacing is miniaturized, the total capacity Cf with the silicon substrate per unit length increases as further miniaturization is attained and when W/H is more than 1. This results because, although the capacity C11 between the wiring and the silicon substrate decreases, the capacity C12 between adjacent wiring separated by wiring spacing S contrarily increases. That is, although operating speed can be increased for individual elements of a semiconductor integrated circuit through miniaturization, wiring resistance and stray capacity increases in the wiring interconnecting these elements by miniaturization. Consequently, the operating speed for the entire LSI is not improved at all. Both of FIGS. 14 and 15 show results of analysis on the stray capacity between the silicon substrate and the wiring disposed through an insulating film, however, they do not address the stray capacity between the wiring layers, even though the situation is the same for the stray capacity between the wiring layers.

Thus, it is an urgent necessity, in light of the foregoing discussion, to develop an inter-layer insulating film with a low dielectric constant εr in place of $Si_3N_4$ (εr: 7 or less) and silicon oxide (εr: 3.9 or less) which are insulating films commonly used in the LSI technology. An amorphous carbon fluoride film with a dielectric constant εr<3 is disclosed in Japanese Patent Application Laid-Open Nos. 08-83842, 08-222557, 08-236517 and the like is expected as a suitable material with a low dielectric constant εr.

BRIEF SUMMARY OF THE INVENTION

As described above, since the amorphous carbon fluoride film has a low dielectric constant εr, it is expected to be suitable as an inter-layer insulating film in multilayer wiring. However, there are still problems in the technology of forming a contact hole contacting a semiconductor diffusion layer or a via hole for connecting wiring layers, which prevent it from being put in practical use. The inventors tried to open a hole in an amorphous carbon fluoride by referring to the description in Japanese Patent Application Laid-Open No. 5-74962 which is directed to an inter-layer insulating film which is believed to be a film similar to the amorphous carbon fluoride disclosed in Japanese Patent Application Laid-Open Nos. 08-83842, 08-222557, 08-236517. Japanese Patent Application Laid-Open No. 5-74962 shows that conventional photolithography technology can be used, thus the process is to use conventional resist which is a mixture of phenol resin and photosensitive agent or a resin such as cyclized rubber and photosensitive resin, to apply it on an amorphous carbon fluoride film in a thickness of 1–1.5 $\mu$m, and to open a hole with a diameter of 0.2 $\mu$m by assuming a highly integrated LSI of 64 megabit or higher DRAM. The film disclosed in Japanese Patent Application Laid-Open No. 5-74962 has a problem because it contains a large amount of hydrogen, and is poor in thermal resistance which is a requirement for the inter-layer film.

It is desired to realize the structure as shown in FIG. 16 utilizing an amorphous carbon fluoride as an inter-layer insulating film. A technique is described for opening a contact hole 164, or a via hole 1661 or 1662 in the amorphous carbon fluoride inter-layer insulating films. First, the conventional resist described above is applied on the amorphous carbon fluoride, followed by exposure and development to form a selection mask for etching. Subsequently, a hole is opened in the amorphous carbon fluoride by an ion milling process with this resist film as a mask. A hole opening by the ion milling is adopted because the amorphous carbon fluoride film is strong against ordinary acid or alkali, and cannot be strongly etched. However, since the hole is opened by ion milling, which is a substantially pure physical process, the resist as the mask itself, is ground in the course of hole opening in the amorphous carbon fluoride. Thus, the hole can be hardly opened in the amorphous carbon fluoride with a film thickness less than 0.4 $\mu$m by forming the resist in a thickness of 1 $\mu$m or more. However, it is very difficult to open a hole in a film with a thickness of 0.4 $\mu$m or more by the ion milling process.

After opening the hole with the ion milling process, the resist is removed. It is found that film reduction is caused in the amorphous carbon fluoride by wet treatment using resist remover heated to about 100° C. It was further tried to remove the resist with an ashing process in oxygen plasma. However, it is found that even this process rapidly removes the amorphous carbon fluoride together with the resist. That is, it is very difficult to selectively work the amorphous carbon fluoride film with the conventional photolithography technology.

Japanese Patent Application Laid-Open No. 09-246242 discloses a technology to break such a situation, and shows that it is sufficient to use a silicone type resist as a mask for selective etching of the inter-layer insulating film containing the amorphous carbon fluoride film. This is because the silicone type resist is hot etched by oxygen plasma. In addition, an arrangement is adopted, in which a silicon oxide film, silicon nitride film, or silicon oxi-nitride film, which is a mixed film of both, is disposed on at least one principle plane of the amorphous carbon fluoride film. It is shown to be effective in improving adhesion near the inter-layer insulating film particularly when the stoichiometric ratio of the interface contacting at least the amorphous carbon fluoride of the silicon oxide film, silicon nitride film, or silicon oxi-nitride film is made silicon excess. In addition, it is shown that, if the silicon oxide film, silicon nitride film, or silicon oxi-nitride film is disposed on the sectional region of the amorphous carbon fluoride film exposed to the side wall of a hole formed to pass through the insulating film containing the amorphous carbon fluoride film, then the degree of freedom can be significantly increased for the conditions in forming a conductive plug. The conductive plug is subsequently buried in the hole, whereby a semiconductor device having a conductive plug with low specific resistance can be obtained. It is also shown that adhesion of the conductive plug is also improved if the silicon oxide film, silicon nitride film, or silicon oxi-nitride film is silicon excess in the composition of the film adjacent to the amorphous carbon fluoride film.

It is also described that, if an oxide film, nitride film, or oxi-nitride film providing improvement of adhesion to the top surface of the amorphous carbon fluoride film is disposed on an insulating layer containing the amorphous carbon fluoride film, the surface of amorphous carbon fluoride film which has been uneven due to burying of a wiring layer or the like can be flattened in good reproducibility with chemical mechanical polishing by detecting the oxide film, nitride film or oxi-nitride film existing in the recessed portion for completion of polishing.

As described above, Japanese Patent Application No. 09-246242 shows that processing of the amorphous carbon fluoride film becomes possible by silicone resist. However, since the silicone resist is not common, and is negative resist, there is a problem that it is not a good compatible with the current LSI process technology mainly using positive resist. The reason why the positive resist is mainly used in the LSI process lies in that, as well known, it provides higher processing accuracy than the negative resist. Although sufficient processing accuracy has been obtained on the laboratory level even with the silicone type resist, to introduce the amorphous carbon fluoride film in an actual LSI manufacturing line, it is necessary to build a process constituted by positive resist which is a mixture of phenol resin and photosensitive resin or a resin such as cyclized rubber and photosensitive resin.

Furthermore, in the flattening process by the chemical mechanical polishing, although there is no problem in the laboratory level, it is found to be difficult to make the process as stable as in polishing a conventional film such as silicon oxide film.

Here, the object of the present invention is to provide a technology for selectively forming a contact hole or via hole when an amorphous carbon fluoride film is applied on an inter-layer insulating film with low dielectric constant $\epsilon r$. Such a technology is effective for solving the problems of interconnecting delay or crosstalk, burying wiring, and a practical LSI process using conventional positive resist similar to that described mainly on the technology for flattening the inter-layer insulating film in Japanese Patent Application Laid-Open No. 5-74962. However, the present invention also applies to not only an LSI chip having a multilayer wiring structure, but also a device in which a number of LSI chips are mounted on a substrate, such as a multi-chip module.

The present invention improves adhesion with another material by making one principle plane an amorphous carbon fluoride film coated with a DLC (diamond like carbon) film containing hydrogen to prevent fluorine in the amorphous carbon fluoride film from being emitted outside, and by removing fluorine in a surface contacting another material. The addition of hydrogen provides the following effects:

When the amorphous carbon fluoride film is applied to an LSI, it is effective to use a DLC film containing hydrogen in at least one of its primary planes, and an amorphous carbon fluoride film coated with at least one layer of film selected from a silicon excess silicon oxide film, silicon nitride film, or silicon oxi-nitride film. In this case, adhesion with another material is significantly improved by adjusting the supply of gas of the chemical vapor deposition (CVD) process to deposit a silicon excess silicon oxide film, silicon nitride film, or silicon oxi-nitride film, which is a mixed film of both (hereinafter comprehensively called "silicon excess film"). The CVD process for the silicon excess film uses an approach to mix gas containing silicon, such as silane ($SiH_4$), and gas containing oxygen or nitrogen, such as $O_2$, nitrogen monoxide (NO) or ammonia ($NH_3$). In an adhesion layer consisting of the DLC film containing hydrogen and the silicon excess film, carbons, a DLC component element, are terminated by rich silicon and hydrogen in the silicon excess film, and are bound to provide enhancement of adhesion.

In particular, adhesion with another material is significantly high for an amorphous carbon fluoride film which has an adhesion layer with a transition layer in which at least carbon and silicon mix in the interface between a DLC film containing hydrogen, and at least one layer of silicon excess film.

Formation of such adhesion layer first enables it to implement, on a practical level, a semiconductor device in which at least part of insulating material is constituted by an amorphous carbon fluoride.

In particular, if an amorphous carbon fluoride film with an adhesion layer as described above is applied to at least a part of the inter-layer insulating film in a multilayer wiring structure, it is possible to implement a semiconductor device with sufficiently high process reliability and small wiring or inter-wiring layer capacity.

In addition, in such case, a semiconductor device with small wiring or inter-wiring capacity can be implemented with a high degree of freedom as if a conventional silicon oxide film is used, by at least locally disposing an insulating layer containing at least an amorphous carbon fluoride film on each surface of which at least one layer of silicon excess film, and an insulating film consisting of a DLC film are disposed (such composite film being called a low dielectric constant inter-layer insulating film).

In such case, it is not necessary to attain insulation only with the low dielectric constant inter-layer insulating film. In some cases, a semiconductor device with a low inter-wiring layer capacity may be sufficiently implemented by using it on at least a part of the inter-layer insulating film. Particularly, if the wiring layers are separated by a composite insulating film at least consisting of a low dielectric constant insulating film and at least one layer of silicon type insulating film selected from a silicon oxide film or silicon nitride film, or silicon oxi-nitride film. As such, it is possible to obtain a structure as a semiconductor device which can assure insulation between the wiring layers using a silicon type insulating film which has exhibited good showing in the LSI, and can be sufficiently manufactured on the existing manufacturing process.

In particular, the existing polishing technology can be used to produce a inter-wiring layer insulating film in which a low dielectric constant inter-layer insulating film is arranged to coat an under layer wiring layer close to the silicon substrate. Further, the surface layer is substantially flat on a composite insulating film consisting of at least one layer of insulating film (called flattened insulating film), which is selected from a silicon oxide film, silicon nitride film, or silicon oxi-nitride film, to coat the low dielectric constant inter-layer insulating film, whereby a semiconductor device sufficiently accommodating miniaturization can be provided.

The present invention enables a DLC film or amorphous carbon fluoride film to be selectively etched in an oxygen plasma using the flattened insulating film as a mask, so that a manufacturing process for semiconductor device can be attained by processing with positive resist. Especially, in etching the DLC film or amorphous carbon fluoride film in the oxygen plasma, it is possible to reduce side etching as low as possible by applying high frequency bias power of 200 W or more to an electrode on which an etched wafer is disposed.

Since the flattened insulating film serves as the hard mask after the steps of: forming a low dielectric constant inter-layer insulating film coating an under layer wiring layer close to a silicon substrate, forming at least one layer of flattened insulating film selected from a silicon oxide film or silicon nitride film, or silicon oxi-nitride film, and polishing the surface of the flattened insulating film, it would be possible to implement a semiconductor device having inter-layer insulating film with low dielectric constant characteristics without particular increase of the number of processes.

Etching controllability for a via hole or the like is very high because it possible to easily attain the step of etching a silicon oxide film or silicon nitride film, or silicon oxi-nitride film with a DLC film or amorphous carbon fluoride film as an etching stopper, or conversely, the step of etching a DLC film or amorphous carbon fluoride film with a silicon oxide film or silicon nitride film, or silicon oxi-nitride film as an etching stopper.

While an amorphous carbon fluoride film is described herein, diffraction lines may be observed through X-ray diffraction experiment or the like. However, they do not impair characteristics such as dielectric constant characteristics. Thus, there may locally exist microcrystals, but they are inclusively called herein, the amorphous carbon fluoride.

BRIEF DESCRIPTION OF THE DRAWINGS

This object and further objects, features and advantages of this invention will become more apparent by reference to the following detailed description of the invention taken in conjunction with the accompanying drawings, wherein.

DETAILED DESCRIPTION OF THE PREFERRED EMBODIMENTS

Now, embodiments of the invention are described in detail with reference to the drawings.

Embodiment 1 of the Invention

Figure 1:
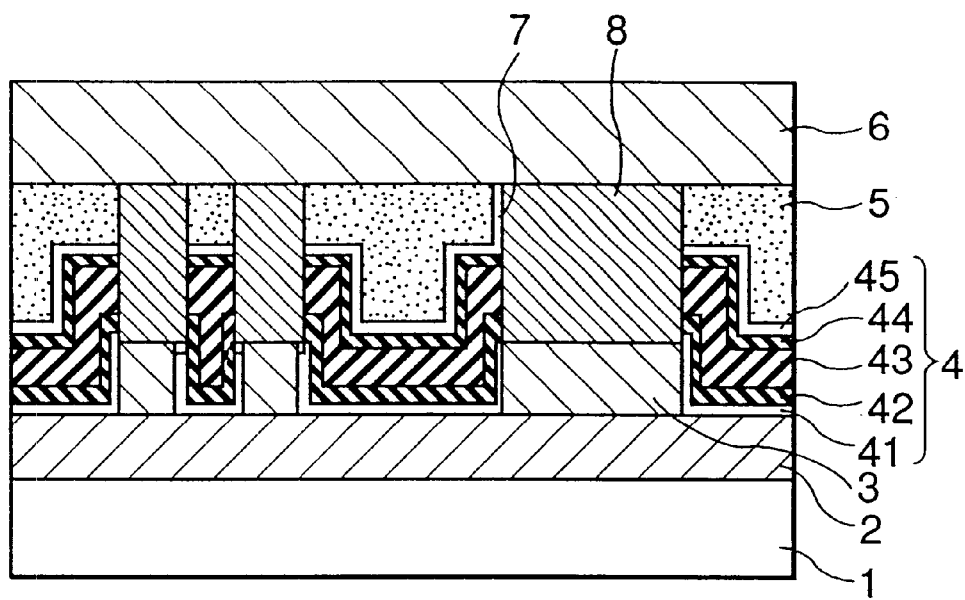
FIG. 1 is a sectional view of a completed multilayer wiring structure obtained by a first embodiment of the present invention.

An embodiment of the present invention is described for a case of multilayer wiring having a two-layer structure, the sectional view of which is shown in FIG. 1. It is a matter of course that wiring in any number of layers be repeated using the technology described in the following. FIGS. 2 through 5 show steps for forming FIG. 1.

First, the final sectional structure of FIG. 1 is described. This figure shows a case in manufacturing a two-layer wiring structure. The lowermost first wiring layer 3 is deposited on a silicon substrate 1 provided with a device region (not shown) such as a diffusion layer through an insulating film 2. Provided on the wiring layer 3 is a second wiring layer 6 through a low dielectric constant inter-layer insulating film 4 consisting of a silicon excess film 41, a DLC film 42, an amorphous carbon fluoride film 43, a DLC film 44 and a silicon excess layer 45, and a flattened insulating film 5 also serving as a part of the inter-layer insulating film. The first wiring layer 3 and the second wiring layer 6 are electrically connected by a via plug 8 formed in an opening 7 in all inter-layer insulating films 4 and 5.

Now, the manufacturing process for the structure shown as section in FIG. 1 is described in detail with reference to the sectional views of process steps shown in FIGS. 2 through 5.

Figure 2A:
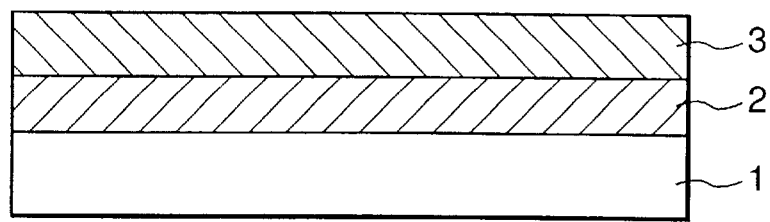
FIGS. 2(a) to 2(c) are sectional views of major manufacturing steps of the manufacturing process in which the multilayer wiring structure of FIG. 1 is formed.
Figure 2B:
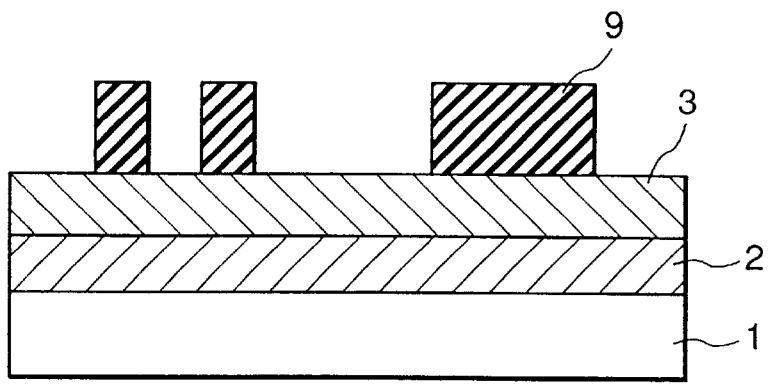

First, the step of FIG. 2(a) is described. A multilayer structure of this semiconductor device is formed by forming the insulating film 2, of material such as phosphor glass (PSG) with a conventional chemical vapor deposition (hereinafter called CVD) process on a silicon wafer 1 previously formed with a device forming region such as a diffusion layer (not shown). The insulating film 2 is first formed with a connection hole (contact hole, not shown) to a semiconductor element region such as a diffusion layer on the silicon substrate 1 by a conventional process. Here, an amorphous carbon fluoride film is not used as the insulating film directly formed on the silicon substrate 1, but the conventional PSG insulating film 2 is used as described above. However, it should be remembered that the low dielectric constant inter-layer insulating film 4, consisting of the silicon excess layer 41, the DLC film 42, the amorphous carbon fluoride film 43, the DLC film 44, and a silicon excess layer 45, which is a major component of the present invention, may be applied as the insulating film 2.

Figure 2C:
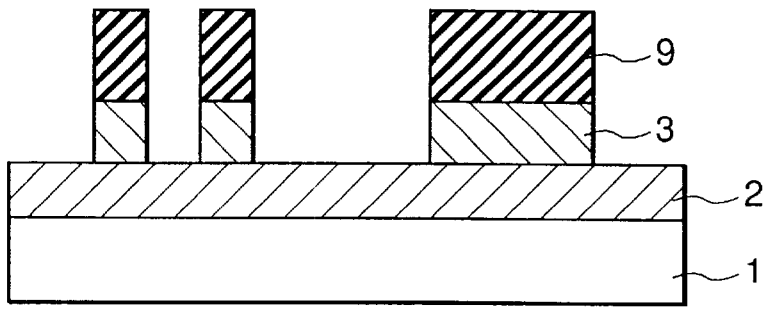

Next, the lowermost first wiring layer 3 is formed on the entire surface of the silicon substrate as titanium nitride (TiN) in several to several tens nanometers, aluminum (Al) (although AlSiCu alloy is actually used, it is indicated as an Al layer) in 600 nm, and again TiN in several to several tens nanometers by a sputtering process (FIG. 2(a) shows this TiN/Al/TiN structure as an integral structure). Next, a resist mask 9 for selective etching is formed by the conventional lithography technology (FIG. 2(b)). The conventional dry etching is performed to pattern the first wiring 3 on the lowermost layer into wiring as shown in FIG. 2(c). In the embodiment, the lowermost first wiring layer 3 had the minimum wiring width of 0.25 μm. The minimum wiring spacing was manufactured up to 0.35 μm, but a wider wiring section was also formed as shown in the figure by assuming an actual LSI.

Next, the process proceeds to formation of an inter-layer insulating film constituting the major part of the present invention by removing the resist mask 9. First, the device and process used for forming the inter-layer film is described in general.

While the device for growing the amorphous carbon fluoride film has been described in Japanese Patent Application Laid-Open No. 8-83842, 8-222557, or 8-236517, the low dielectric constant inter-layer insulating film 4 of the present invention consisting of: the silicon excess layer 41, the DLC film 42, the amorphous carbon fluoride film 43, the DLC film 44, and the silicon excess layer 45, is entirely formed by a device similar to that shown in the following.

Figure 6:
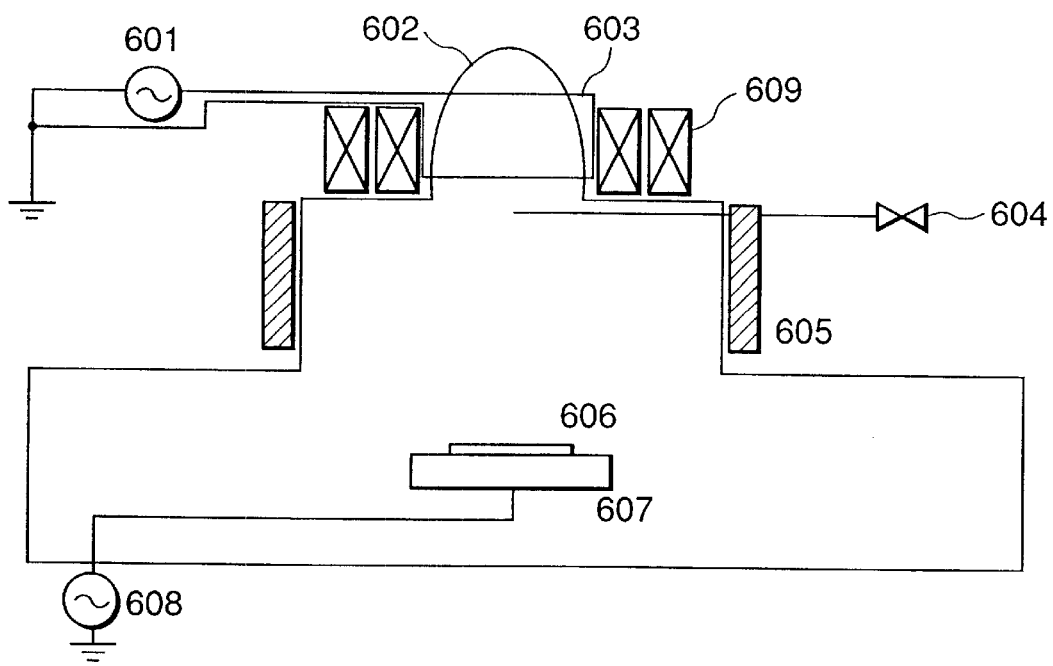
FIG. 6 is a conceptual diagram of a helicon plasma device used for deposition of an amorphous carbon fluoride film, DLC film, silicon excess layer, and flattened layer, or etching of an amorphous carbon fluoride film and DLC film.

A plasma film forming device used is conceptually shown in FIG. 6. In the device, a silicon wafer 606 (a silicon plate where any material other than silicon exists on at least a part of its surface is called a silicon wafer, and distinguished from the silicon substrate 1) is deposited on a sample holder 607 also serving as a lower electrode. The sample holder 607 has a structure where high frequency of 400 kHz (bias source 608), independent from the plasma source, can be applied. Application of high frequency to the sample holder 607 enables it to effectively apply negative bias of several tens to several hundred volts to the silicon wafer 606. The device shown in FIG. 6 is to generate the plasma with a helicon wave. It guides the high frequency from a high frequency plasma source 601 of 13.56 MHz to an antenna 603 placed around a quartz bell-jar 602 to act as a magnetic field of an electromagnet 609 also disposed outside the quartz bell-jar 602, thereby effectively generating the plasma in the quarts bell-jar 602.

The silicon wafer 606 is first introduced into a preparation chamber (not shown) provided in a stage prior to a plasma generation chamber and shut down by a gate valve (not shown). The preparation chamber is evacuated to a degree of vacuum of $10^{-7}$ torr. Next, the silicon wafer 606 is introduced into the plasma generation chamber maintained at a high vacuum of $10^{-8}$ torr or less by opening the gate valve, and placing it on the sample holder 607. Thereafter, the gate valve is closed, and after the degree of vacuum becomes $10^{-8}$ torr or less again in the plasma generation chamber, material gas 604 such as $CF_4$ and $CH_4$, and $N_2$ gas is introduced into the plasma generation chamber to typically adjust the degree of vacuum to 0.01–0.05 torr. Here, the amorphous carbon fluoride film, DLC film or silicon excess film is formed by applying and discharging a high frequency of 13.56 MHz or direct current to and from the antenna 603 for generating the plasma. The device used for the embodiment of the present invention has two film formation chambers as shown in FIG. 6, and is arranged to be able to form the amorphous carbon fluoride film and the DLC film in one film formation chamber (called the chamber 1), and further to form the silicon excess film and the flattened film in the later film formation chamber (called the chamber 2), so that the low dielectric constant inter-layer insulating film 4, consisting of the silicon excess layer 41, the DLC film 42, the amorphous carbon fluoride film 43, the DLC film 44, and a silicon excess layer 45 are continuously formed. While the embodiment of the present invention continuously forms the low dielectric constant inter-layer insulating film 4 in the vacuum through process, there is no necessity to continuously perform this step constituting the major part of the present invention. The device used in this embodiment is for a silicon wafer with a diameter of 6 inches. Accordingly, while the high frequency power for applying bias or the like is indicated in an absolute value as seen in the following, they should be corrected to appropriate values depending on the size of silicon wafer. However, power may be sufficient to be increased or decreased substantially proportional to the area of wafer.

In forming the low dielectric constant inter-layer insulating film 4, consisting of the silicon excess layer 41, the DLC film 42, the amorphous carbon fluoride film 43, the DLC film 44, and a silicon excess layer 45 of the present invention, there may arise a problem of peeling in forming the silicon excess layer 45 due to the structure of the cooling unit for cooling the silicon substrate. This problem is addressed in detail in the following.

Figure 17:
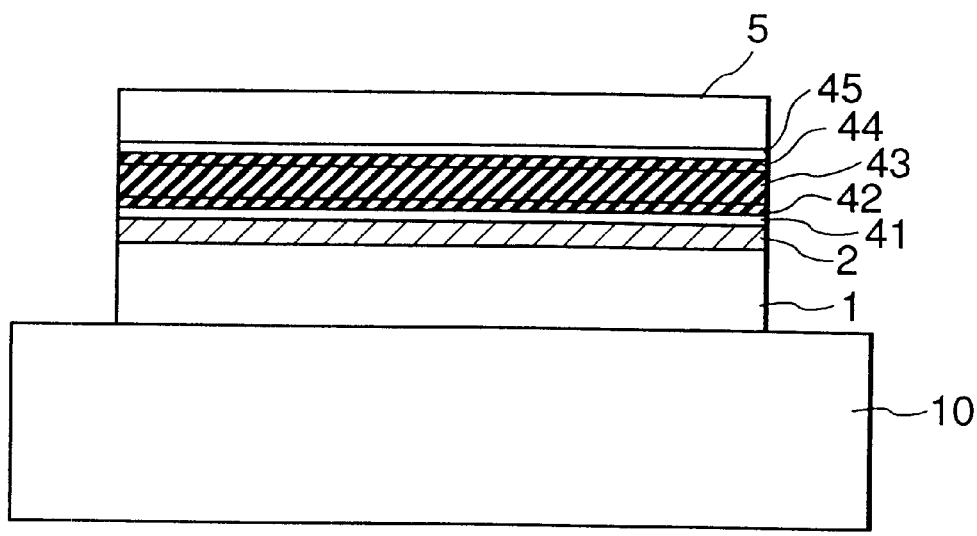
FIG. 17 is a conceptual diagram of a sample holder for cooling a wider area of silicon substrate.
Figure 18:
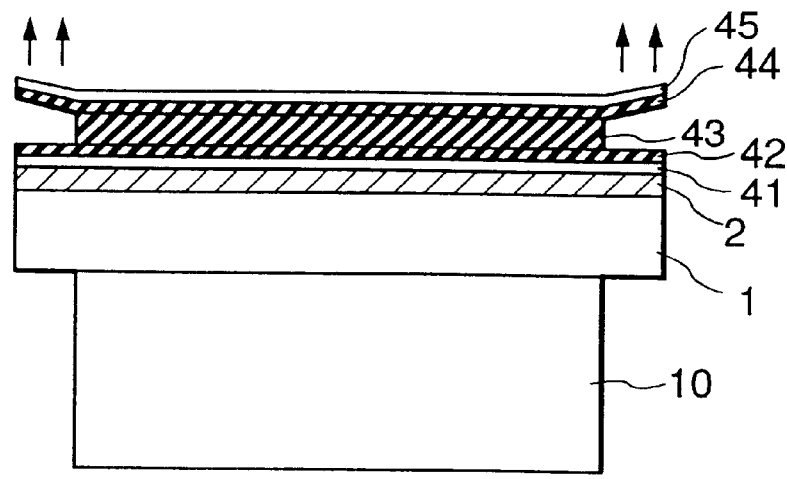
FIG. 18 is a conceptual diagram of a sample holder for coding a narrower area of silicon substrate.

In the device of FIG. 6, the sample holder 607 contains therein a cooling unit for suppressing heating of the substrate by the plasma used for film formation. In forming the low dielectric constant interlayer film shown in the embodiment 1, as shown in FIG. 17 (the first wiring layer being omitted), the silicon excess film 45 is formed after sequentially forming the silicon excess film 41, the DLC film 42, the amorphous carbon fluoride film 43, and the DLC film 44. However, if the cooling unit 10 is smaller than the silicon substrate as shown in FIG. 18, so that the entire silicon substrate cannot be completely cooled, temperature rises in the periphery of the substrate due to heating by the plasma for forming the silicon excess film. If the temperature of the periphery of the substrate becomes 450° C. or higher, the amorphous carbon fluoride film is decomposed, thereby causing the film to peel from the periphery.

Thus, the cooling unit 10 built in the sample holder 607 should be made larger than the silicon substrate as in FIG. 17. Making the cooling unit larger than the silicon substrate enables it to prevent film peeling, and to form the low dielectric constant inter-layer film. In addition, since it is anticipated that a similar phenomenon as in the formation of the silicon excess film 45 may arise in forming the flattened insulating film 5 to be formed on the low dielectric constant inter-layer film, it is effective to make the cooling unit larger than the silicon substrate.

The formation of inter-layer insulating film is now described in detail.

Figure 3D:
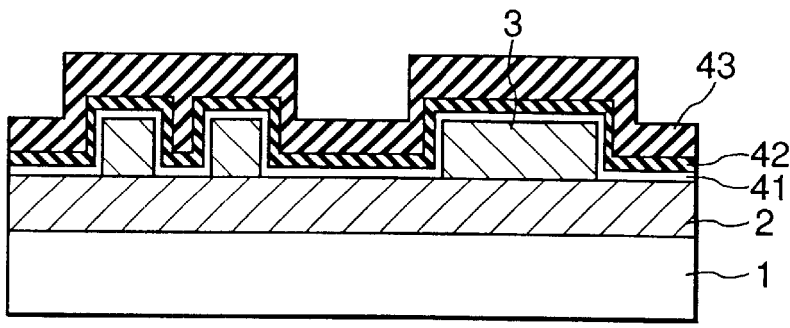
FIGS. 3(d) to 3(f) are sectional views of major manufacturing steps of the manufacturing process successive to FIG. 2(c) in which the multilayer wiring structure of FIG. 1 is formed.
Figure 3E:
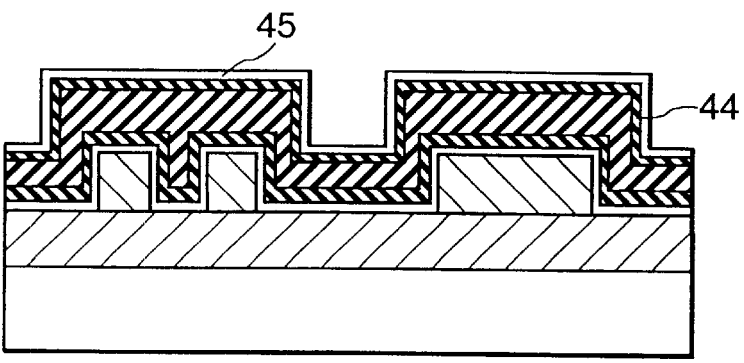
Figure 3F:
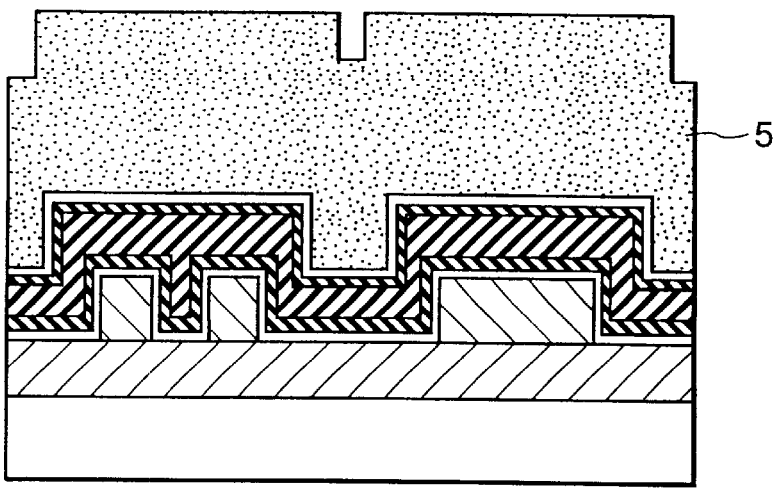

First, after the resist mask 9 is removed through FIG. 2(*c*), the silicon wafer 606 formed with the wiring pattern is placed in the chamber 2 to form the silicon excess layer 41. The substrate temperature is determined to be in a range between 200° C. and 400° C. by taking into consideration thermal resistance of the Al wiring, and 2.5 kW is applied as the high frequency power for plasma. In this device, if the supply ratio of $SiH_4$ gas and oxygen is determined to be 1:2 in forming, for example, the silicon oxide film, silicon oxide can be obtained substantially in the stoichiometric ratio. However, if the supply ratio is 1:1, SiO is resulted, so that silicon can be made excess. The supply ratio of 1:2 means that the ratio of the number of silicon atoms to the number of oxygen atoms being supplied is 1:2, and indicates that the material supply ration substantially attains the primary stoichiometric ratio of the resultant silicon oxide film, silicon oxide. That is, the film formation by the high density plasma device as shown in FIG. 6 is found to be excellent in controllability in that the composition ratio in the resultant film is determined by the supply ratio of film composing atoms in the material gas. While, in an embodiment forming a silicon excess film, the film is formed at the supply ratio 1:1, the silicon excess layer 41 can provide enhancement of adhesion as described above if silicon is in excess by several percent compared with the stoichiometric ratio. In addition, it is sufficient to provide a silicon excess layer 41 with thickness of 5 nm or more to enhance the adhesion. As long as the thickness is 100 nm or less, it does not impair the low dielectric constant characteristics of the low dielectric constant inter-layer insulating film 4. In forming the silicon excess film 4, no particular bias is applied to the silicon wafer 606. The silicon excess film 41 also performs covering on the side of the first wiring layer 3 as shown in FIG. 3(*d*). The silicon excess film 41 provides together with the DLC film 42, enhancement of adhesion with the amorphous carbon fluoride film 43, as well as with TiN existing on the top surface of Al wiring of the wiring layer 3. In addition, the silicon excess film 41 also serves to protect the Al exposed on the side wall of the wiring layer 3 when the amorphous carbon fluoride film is formed. That is, when the amorphous carbon fluoride film 43 is formed, since fluorine gas is contained in the material, Al is corroded if it is exposed. However, since it is covered by the silicon excess film 41, corrosion of the Al can be completely eliminated in forming the amorphous carbon fluoride film 43. Here, the film formation rate is about 300 nm/m, and since the example of the embodiment has a thickness of 50 nm, the film formation time is about 10 seconds.

Then, the silicon wafer 606 is moved from the chamber 2 to the chamber 1 so that the process proceeds to the formation of DLC film 42. Since it was experimentally confirmed that the DLC film 42 could be obtained only when the substrate temperature is established at about 200° C. or less, it was determined to be 100°C. for the embodiment. In addition, as the high frequency power for plasma, 2.5 kW was applied as in the formation of the silicon excess film. $CH_4$ was used as the material gas, and the film formation was carried out by establishing the pressure in the growing chamber at 2 milli torr. It is particularly important in the formation of DLC film to apply bias to the substrate. While, in the embodiment, it was carried out by applying 50 W of bias application high frequency, a suitable addition of hydrogen can be attained by supplying power of 100 W or less. If the film was formed without applying bias, it was observed that the hydrogen concentration became high, and the film itself became brittle, resulting in deterioration of adhesion of the film in the subsequent CMP step or heat treatment step. Thus, it was necessary to apply high frequency power of 20 W or more for a bias. On the other hand, if the power was increased to excess 100 W and to be 150 W, the hydrogen concentration was lowered, leading to deterioration of adhesion with the silicon excess layer 41. It was sufficient that the thickness of the DLC film 42 was in the same range as that of the thickness of the silicon excess layer 41, which was 5 nm or more but 100 nm or less. The reason why this range was established is also the same as in the case of the silicon excess layer. In addition, the film formation rate was also 300 nm/m in the case of DLC film. Since the example of the embodiment was also 50 nm thick, the film formation time was also about 10 seconds.

After the silicon excess film 41 and the DLC film 42 are formed to constitute the adhesion layer, the amorphous carbon fluoride film 43 is finally formed. In the embodiment, after the DLC film 42 is deposited, the amorphous carbon fluoride film 43 is continuously formed in the chamber 1.

As the film formation conditions for the amorphous carbon fluoride film 43, the substrate should first be at 200° C. or less in deposition. It is because, if the substrate temperature exceeds 200° C., the deposition rate becomes substantially zero. Although exact temperature dependency of deposition rate is yet unknown, it is believed that the adhesion coefficient to the substrate of the reaction species for forming the amorphous carbon fluoride film reduces rapidly as the temperature rises. In the embodiment, the process was carried out at the substrate temperature of 100° C., but the film can be sufficiently formed event at a temperature lower than the room temperature or 20° C. or less. In addition, after the bias application conditions for the silicon wafer substrate 606 were studied for efficiently burying the amorphous carbon fluoride film 43 between wiring, the process was carried out at 30 W as the high frequency power for applying bias. The power was lower when compared with the case of the DLC film 42. If the high frequency power for bias is made 100 W or more, etching is performed instead of deposition. Then, deposition can be attained at the high frequency power of about 10 W to 100 W or less.

Material gas 604 such as $CF_4$ and $CH_4$, and $N_2$ gas were introduced into the plasma generation chamber, with the degree of vacuum being adjusted to 0.01–0.05 torr.

The reason why nitrogen was added in the material gas in the embodiment is to enhance the thermal resistance of the amorphous carbon fluoride film 43 as described in Japanese Patent Application Laid-Open No. 8-236517. It is a matter of course that the technology of the present invention can be effectively applied to an amorphous carbon fluoride film 43 not containing nitrogen. In addition, it was also effective to use material gas containing benzene rings such as toluene to enhance the thermal resistance.

It is a matter of course that, as described in Japanese Application Laid-Open No. 8-236517, at least one kind of gas selected from $CF_4$. $C_2F_6$, $C_3F_8$, $C_4F_8$, and $CHF_3$, or mixture of it and one kind of gas selected from hydrogen $H_2$, or hydrocarbons $CH_4$, $C_2H_6$, $C_2H_4$, $C_2H_2$, and $C_3H_8$ may be used as the material gas for carbon. In addition, the film formation may be carried out by adding $N_2$ as a material for introducing nitrogen, as well as at least one kind of gas selected from NO, $NO_2$, $NH_3$, and $NF_3$. In forming the DLC film 42, it is necessary not to use gas containing fluorine in the above material gasses, but use gas containing hydrogen.

FIG. 3(*d*) is the sectional view of film thus obtained by forming the amorphous carbon fluoride film 43 in the substantially same thickness of about 600 nm as that of the first wiring layer 3. The film formation rate is about 150 nm/m for the amorphous carbon fluoride film 43, which thus can be formed in up to 4 minutes. It is more effective in reducing the capacity as intended by the present invention to arrange the thickness of the amorphous carbon fluoride film 43 to exceed that of the first wiring layer 3. However, even if the amorphous carbon fluoride film 43 has a thinner thickness, it is needless to say that it can contribute to reduction of the capacity. In addition, sufficient enhancement of adhesion may occur by forming the amorphous carbon fluoride film 43 on the silicon excess layer 41 and the DLC layer 42 is believed to lie in the existence of a transition layer which is observed in an interface to the silicon excess layer 41 and the DLC layer 42, or to the amorphous carbon fluoride film 43, and which is a mixture of silicon and carbon in a thickness of several nanometers to about 100 nanometers. The transition layer is formed with an Si—C bond with strong chemical bonding force, which causes the enhancement of adhesion. The role of hydrogen in the DLC layer 42 referred to above is believed that, when carbon atom string terminated with hydrogen is formed, a silicon atom is replaced instead of hydrogen if the silicon excess layer 41 is encountered, so that the Si—C bond can be easily formed.

After a deposition with good adhesion with the amorphous carbon fluoride film 43 and the under layer is thus attained, preparation is started for forming the upper second wiring layer 6.

Here, a 50 nm DLC film 44 is formed on a surface formed with the amorphous carbon fluoride film 43 under the same conditions as the previous DLC layer 42. Next, the silicon wafer 606 is moved from the chamber 1 to the chamber 2 to form a silicon excess layer 45 in a thickness of 50 nm under the same conditions as the previous silicon excess layer 41. Thus, an adhesion layer with another material layer is prepared on both sides of the amorphous carbon fluoride film 43. Here, it is needless to say that respective deposition conditions for the silicon excess layers and the DLC films formed on the both sides may be any combination within the conditions described above. This state is shown in FIG. 3(*e*).

Once the DLC film 44 and the silicon excess layer 45 are prepared for serving as the adhesion layer, a thick flattened insulation film 5 is started to be formed for flattening. In this embodiment, after the silicon excess layer was formed in the previous process, a silicon oxide film was deposited in a thickness of 2 $\mu$m in the chamber 2, by performing deposition for about 10 minutes in a supply ratio of 1:2 of $SiH_4$ and $O_2$, the material gas, which provides a stoichiometric ratio for silicon oxide. This state is shown in FIG. 3(*f*). Substrate temperature in this case is sufficient at 200° C. to 400° C. as in formation of the silicon excess film. However, in this embodiment, it was performed at 200° C., to suppress the temperature as low as possible. A significant difference in the growth conditions from the silicon excess film lies in that a high bias is applied to the silicon substrate in the case of flattened film. In this embodiment, the process was carried out by applying 1 kW as the high frequency power for applying bias. If such large high frequency power is not applied, a cracked pattern may frequently occur in the thick silicon oxide film for flattening. Thus, the high frequency power should exceed 100 W which is higher than in forming the DLC film or the amorphous carbon fluoride film.

Figure 4G:
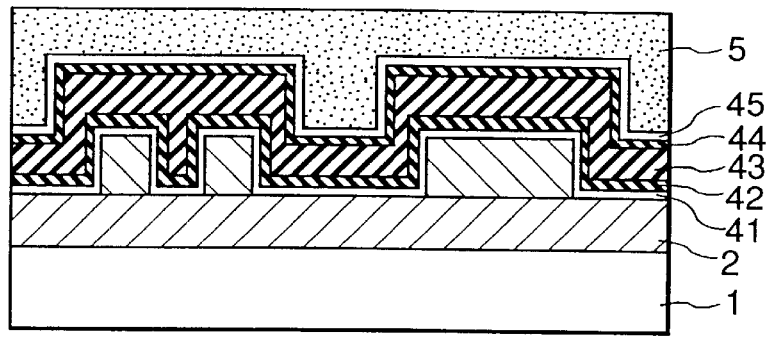
FIGS. 4(g) to 4(i) are sectional views of major manufacturing steps of the manufacturing process successive to FIG. 3(f) in which the multilayer wiring structure of FIG. 1 is formed.
Figure 4H:
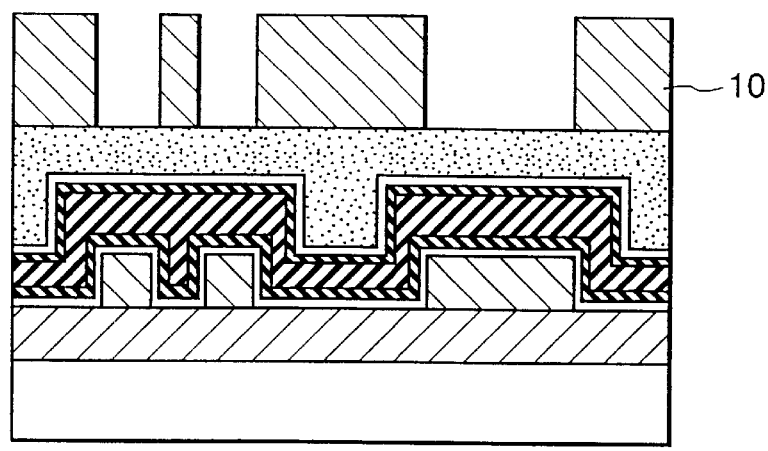
Figure 4I:
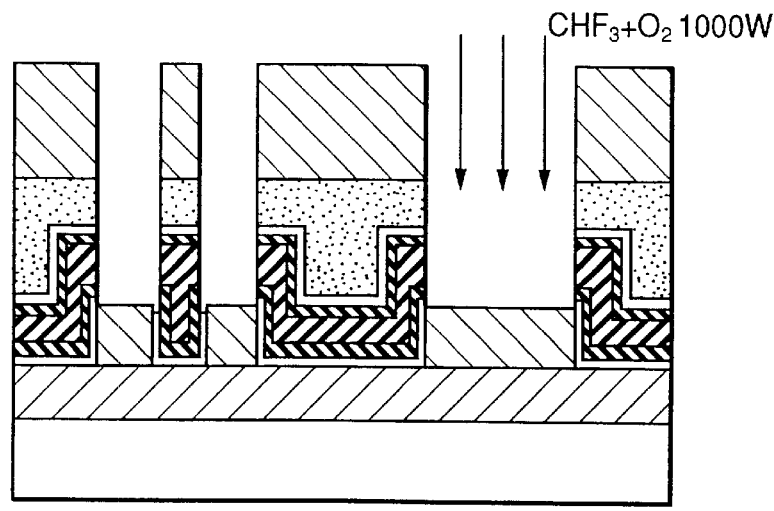

While the thick flattened insulating film 5 is thus obtained, there still remains on its surface an unevenness as large as the height or thickness of the first wiring layer 3. Next, the process proceeds to a flattening step with CMP. Flattening is performed by CMP using conventional alkali slurry. In this embodiment, perfect flattening was attained by polishing the silicon oxide film as the flattened film 5 by 800 nm. This state is shown in FIG. 4(*g*).

The process further proceeds to the step for opening a via hole. First, a resist mask 10 is formed for opening the via hole with the conventional resist preparation process (FIG. 4(*h*)). Next, the silicon oxide film, as the flattened insulating film 5, is selectively etched so that it stops in the silicon oxide film by conventional dry etching using $CF_4$ gas or the like (FIG. 4(*i*)). In this embodiment, the film was etched up to about 800 nm. In the next step, the resist mask 10 is removed by conventional ashing in oxygen plasma. The reason why the etching is interrupted to stop in the silicon oxide film as in FIG. 4(*i*), lies in that the resist mask 10 sometimes firmly attaches, thus, sufficient ashing should be performed. This is because, if the etching is performed up to the DLC film 44, and the resist mask 10 is ashed in the oxygen plasma, the DLC film 44 and the amorphous carbon fluoride film 43 are also etched as the resist mask 10 is removed, the resist mask may not be completely removed. Of course, if ashing of resist can be easily performed, the silicon oxide film can be etched until the DLC film 44 is exposed without removing the resist. It may then be removed at the same time that the DLC film 44, the amorphous carbon fluoride film 43, and the DLC film 42 are etched. Here, the resist 10 is removed by etching the flattened insulating film 5 to the midway as described above to strictly attain a stable process (FIG. 5(*j*)).

Figure 13:
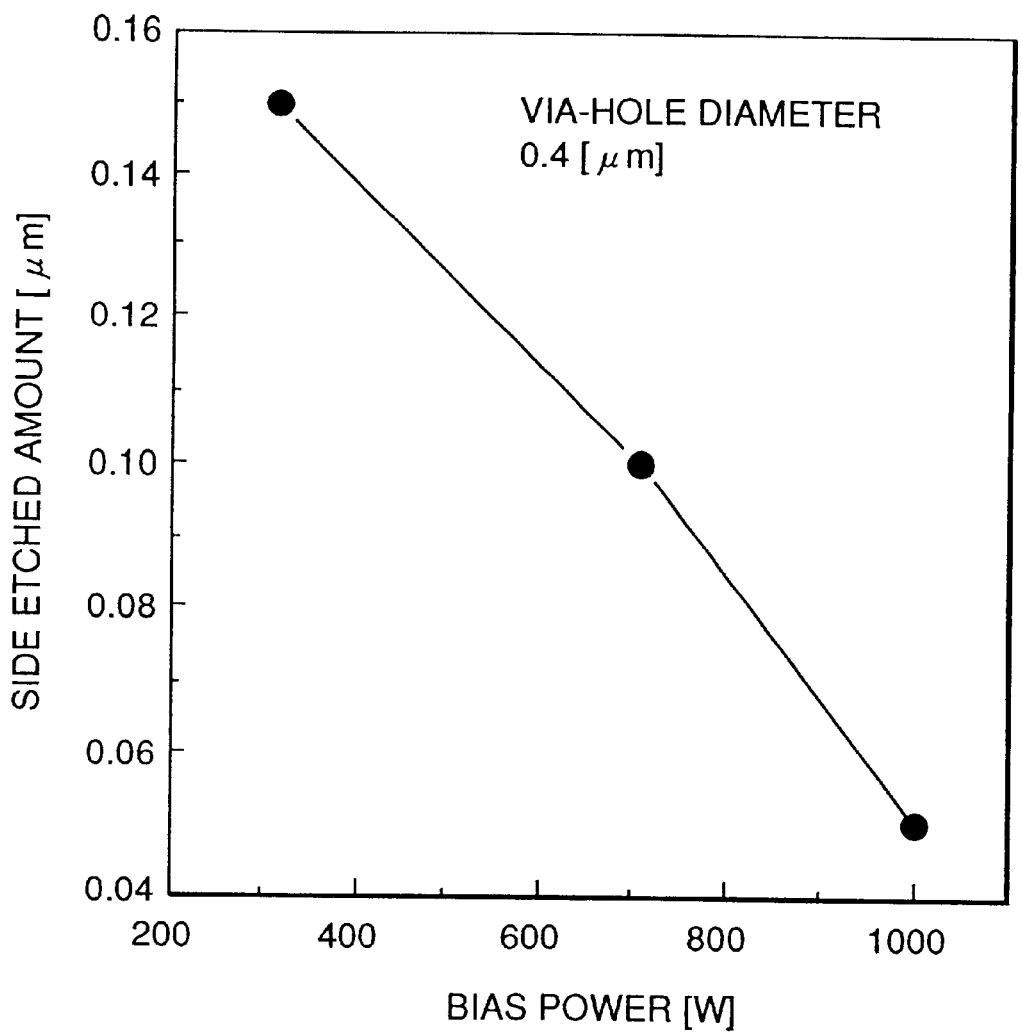
FIG. 13 is a graph showing a relationship between high frequency power for applying bias and amount of side etching in oxygen plasma etching for a DLC film/amorphous carbon fluoride film/DLC film.
Figure 14:
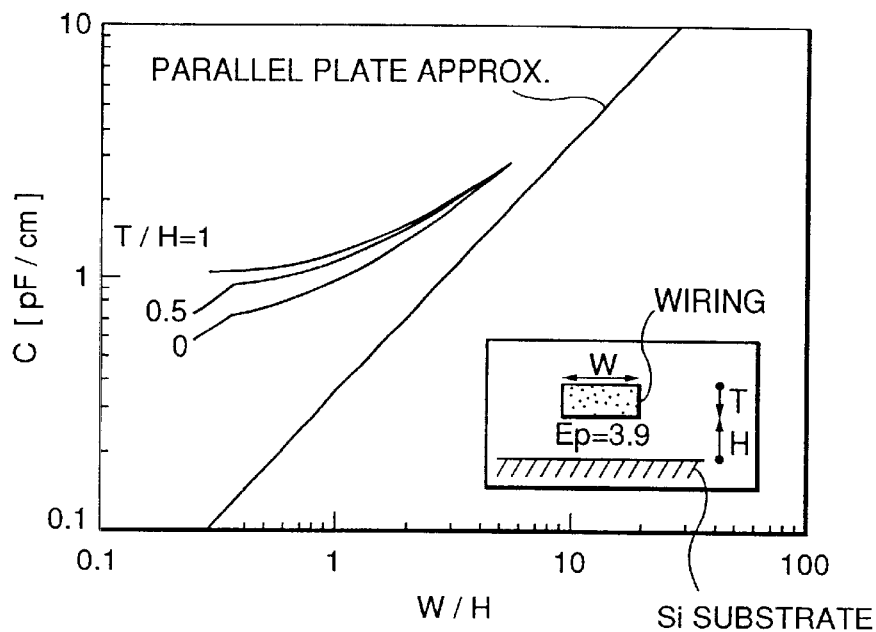
FIG. 14 is a graph showing a relationship of capacity per unit wiring length between an isolated wiring insulated and a silicon substrate as drawn in a sectional structure in the figure.
Figure 15:
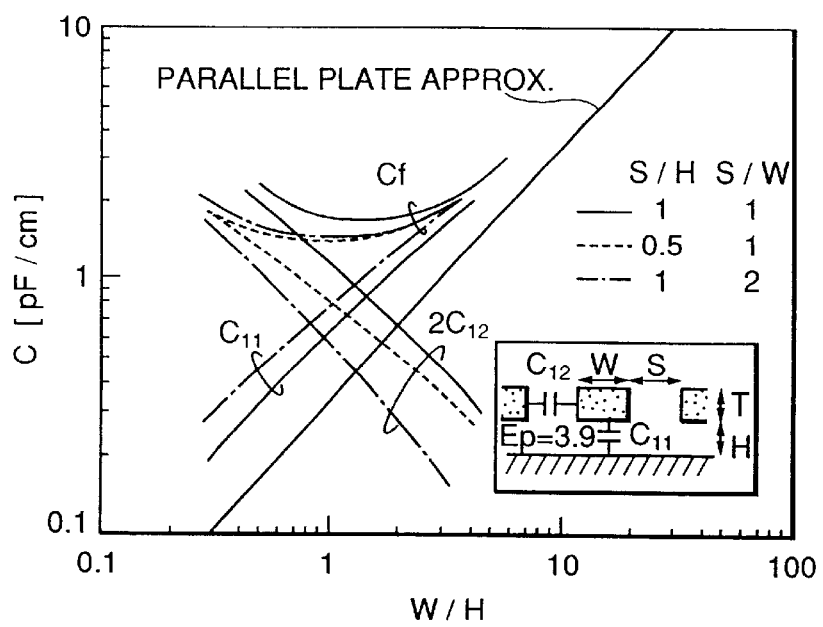
FIG. 15 is a graph showing a relationship of capacity per unit wiring length between one wiring and a silicon substrate in a plurality of wiring arranged in an insulated comb shape shown as a sectional figure in the inset.
Figure 16:
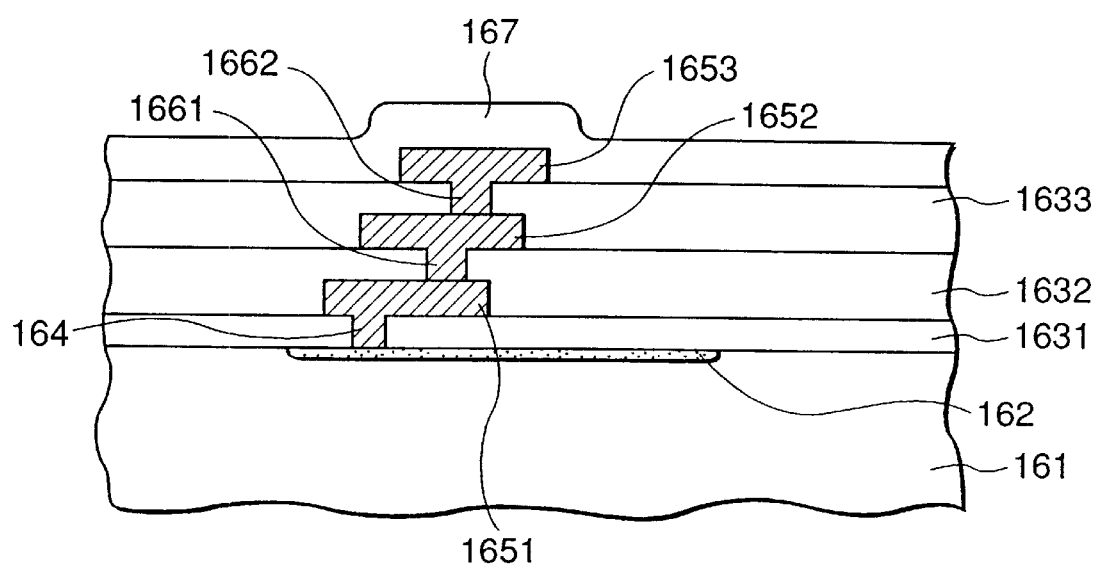
FIG. 16 is a sectional view drawn for illustrating the concept of multilayer wiring.

After removal of the resist, the entire surface of silicon oxide film as the flattened insulating film 5 is again etched by conventional etching means with $CF_4$ gas, so that the DLC film 44 is exposed on the bottom of a via hole. Since the etching speed for the DLC film 44 is slower than that for the silicon oxide film, and the DLC film 44 serves as a so-called etching stopper. The flattened film can then be surely removed from the via hole region on the entire surface of the silicon wafer. Subsequently, the DLC film 44 and the amorphous carbon fluoride film 43 are etched. The etching was performed by introducing oxygen into the chamber 2, of the same plasma device as used for depositing the silicon excess film, to attain a pressure of 1 millitorr. In this case, the etching was performed by setting the substrate temperature of the silicon wafer at 100° C. or less, and applying 1 kW of high frequency for bias. The high frequency power for plasma was 1 kW, which was lower than in the film formation. Making the high frequency power for plasma lower than in the film formation is important in preventing etching damage. In addition, if bias is not applied in etching the substrate, the DLC films 42 and 44, and the amorphous carbon fluoride film 43 are significantly side etched because the etching has isotropy. FIG. 13 shows the amount of side etching to the bias power for a via hole with a diameter of 0.4 $\mu$m and a depth of 0.6 $\mu$m. If the wiring is performed in 0.35 $\mu$m spacing, and side etching is acceptable up to about 0.175 $\mu$m, which is one half the spacing, etching can be performed over the entire range of bias voltage as drawn in FIG. 13.

Figure 5J:
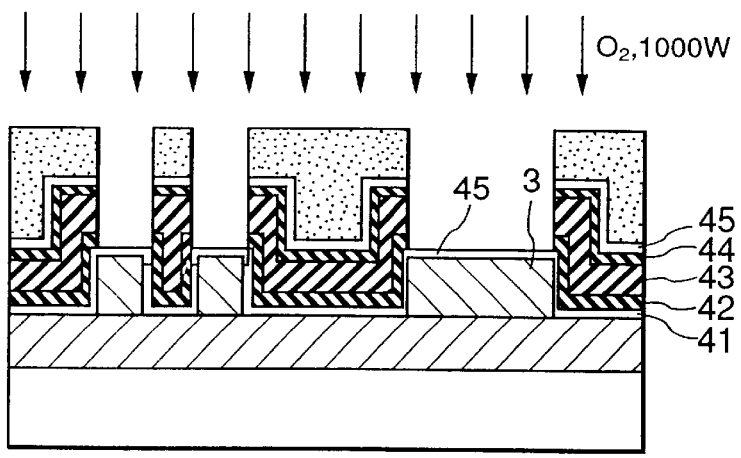
FIGS. 5(j) to 5(l) are sectional views of major manufacturing steps of the manufacturing process successive to FIG. 4(i) in which the multilayer wiring structure of FIG. 1 is formed.
Figure 5K:
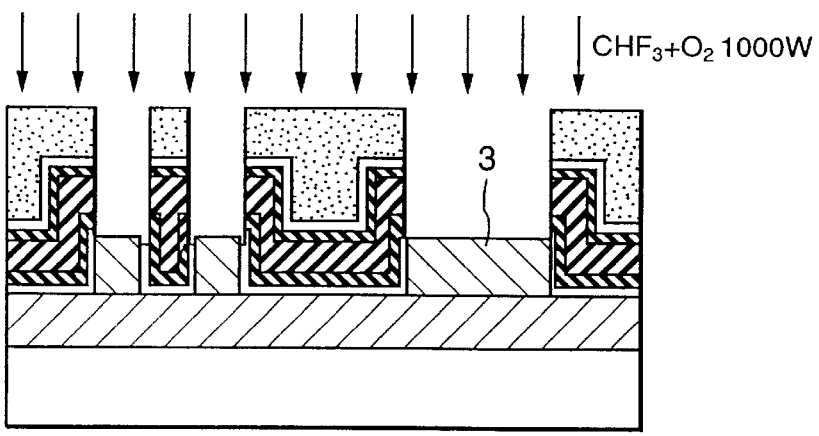
Figure 5L:
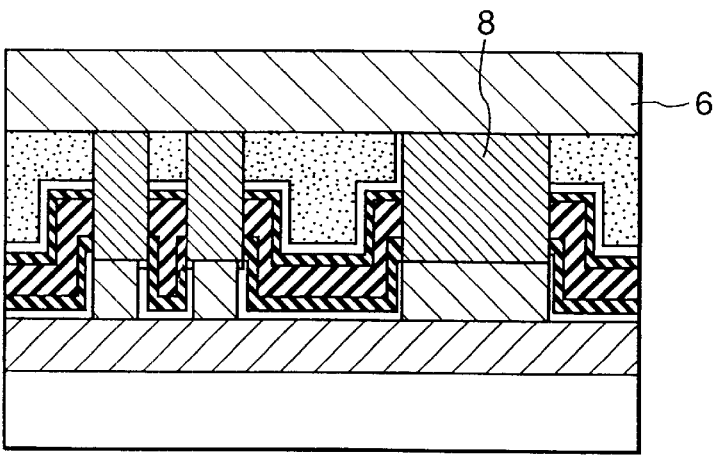

When bias is applied to the substrate, the DLC films 42 and 44, and the amorphous carbon fluoride film 43 are etched in the substantially same shape as the opening to silicon oxide which is the flattened insulating film 5 serving as a selective etching, as shown in FIG. 5(*k*). In etching of the DLC films 42 and 44, and the amorphous carbon fluoride film 43, the silicon excess film 41 serves as the etching stopper.

Therefore, etching can be surely performed to the DLC film and the amorphous carbon fluoride film at the via hole region on the entire surface of the silicon wafer.

Thereafter, when the silicon excess film 41 is lightly etched again by the conventional dry etching means with $CF_4$ gas or the like, the first wiring layer 3 can be exposed on the bottom of the via hole (FIG. 5(*k*)).

Once the via hole is completely opened, wiring material is buried in the opening 7 by the conventional process to form the second wiring layer 6. For example, in this embodiment, the substrate temperature was set to 250° C., tungsten being buried in the via hole by the selective thermal CVD process with WF6 gas as the material to form a via plug 8. This is followed by sequentially forming a TiN layer, an AlSiCu layer and a TiN layer with the sputtering process to form the second wiring layer 6 (FIG. 5(*l*)).

As described, a two-layer wiring structure is implemented, which has an inter-layer insulating film with low dielectric constant mainly consisting of the amorphous carbon fluoride film 43. If it is intended to increase the number of layers, it is a matter of course to repeat the process of FIG. 2(*b*) and later.

While a device with a plasma chamber of parallel plate type may be used to form the amorphous carbon fluoride film with the plasma process, it is advantageous to use various plasma sources such as an ECR (electron cycrotron resonance) plasma source or a helicon wave plasma source.

These are advantageous in generating high density plasma, to increase throughput. In particular, a high density plasma source, as represented by the helicon wave plasma source in which the substrate and a plasma generating electrode are separately provided, enables it to form an amorphous carbon fluoride film containing little hydrogen or the like. Further it is advantageous in burying an inter-layer film between wiring with a high aspect ratio.

In addition, to attain a low dielectric constant of 3 or less, it is preferable that the composition of amorphous carbon fluoride film has a carbon content of 70% or less.

Furthermore, to enhance the adhesion between the amorphous carbon fluoride film and another material layer, a DLC film containing a suitable amount of hydrogen is disposed on the primary plane relating to the adhesion of the amorphous carbon fluoride film, so that fluoride in the amorphous carbon fluoride film is not exposed. Moreover, as described with respect to the embodiment, it is indicated that a DLC film coated by an amorphous carbon fluoride film may be disposed with a silicon oxide film, a silicon nitride film or a silicon oxi-nitride film with the silicon excess storchrometic ratio to adhere an amorphous carbon fluoride film coated by the DLC films on an silicon oxide film, a silicon nitride film, a silicon oxi-nitride film, an alumina film and other insulating films used in various LSI technologies or micro modules; on metal such as TiN, titanium silicide, Al, Al alloy, or copper, or on polysilicon or silicon crystal. It is reasonable to consider that this enhancement of adhesion force is caused from the fact that carbon, once bonded with hydrogen in the DLC film and free silicon atoms in the silicon excess layer, are bonded to form a strong Si—C chemical bond.

Embodiment 2 of the Present Invention

Figure 7:
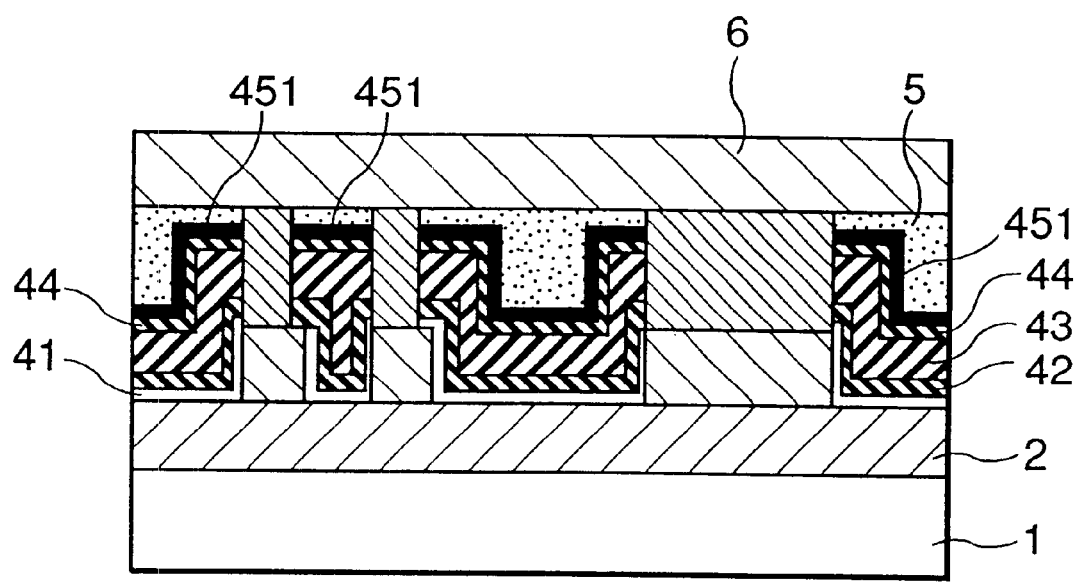
FIG. 7 is a sectional view of a completed multilayer obtained by a second embodiment of the present invention.
Figure 8A:
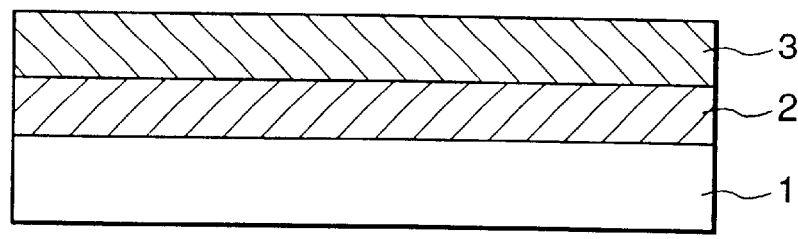
FIGS. 8(a) to 8(c) are sectional views of major manufacturing steps of the manufacturing process in which the multilayer wiring structure of the present invention is formed.
Figure 8B:
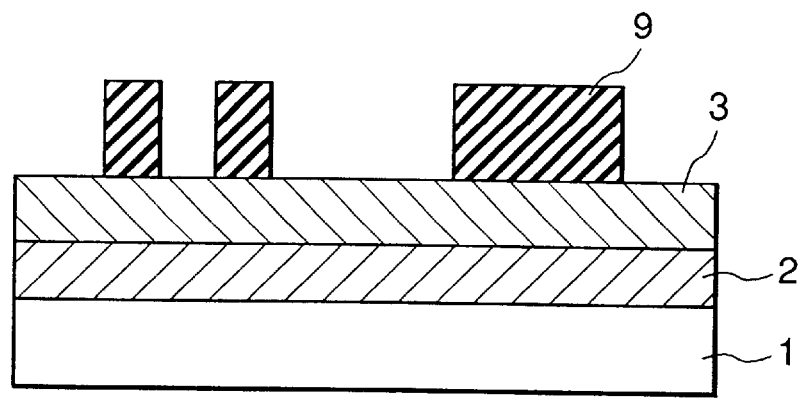
Figure 8C:
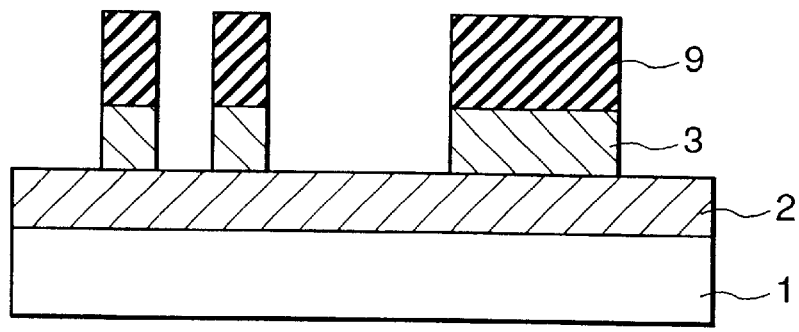
Figure 9D:
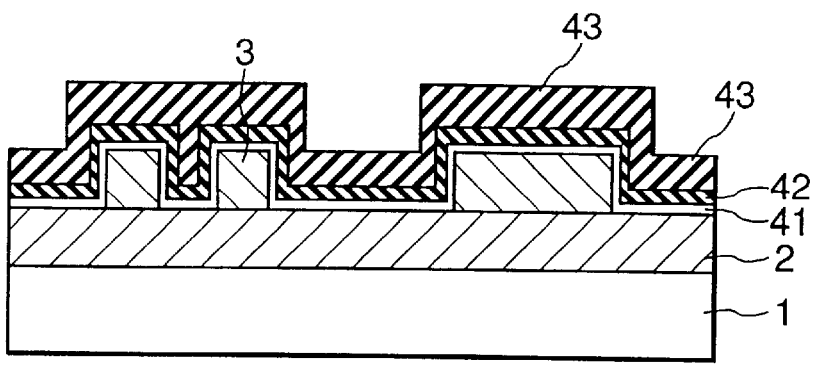
FIGS. 9(d) to 9(f) are sectional views of major manufacturing steps of the manufacturing process successive to FIG. 8(c) in which the multilayer wiring structure of the present invention is formed.
Figure 9E:
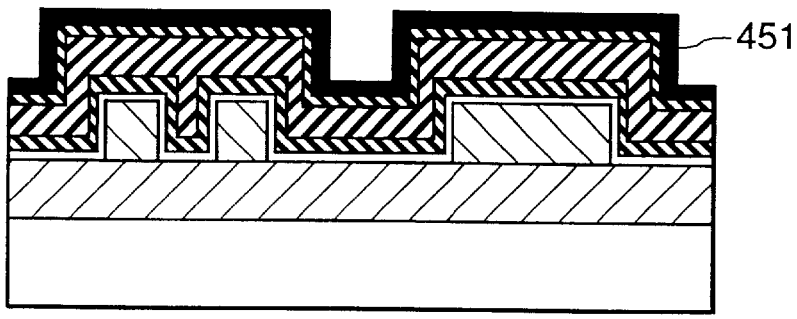
Figure 9F:
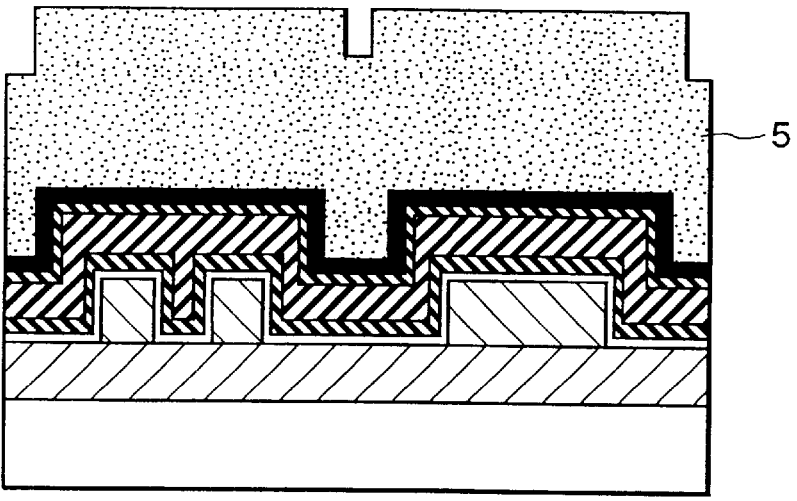
Figure 10G:
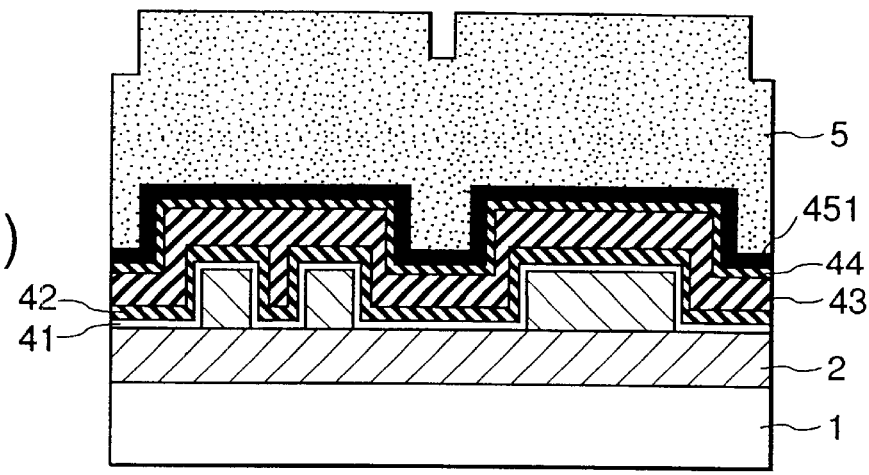
FIGS. 10(g) to 10(i) are sectional views of major manufacturing steps of the manufacturing process successive to FIG. 9(f) in which the multilayer wiring structure of the present invention is formed.
Figure 10H:
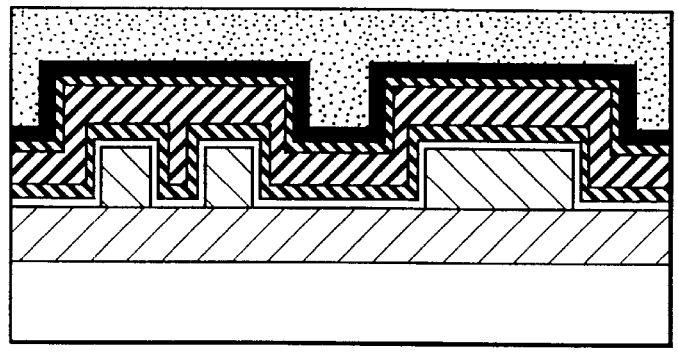
Figure 10I:
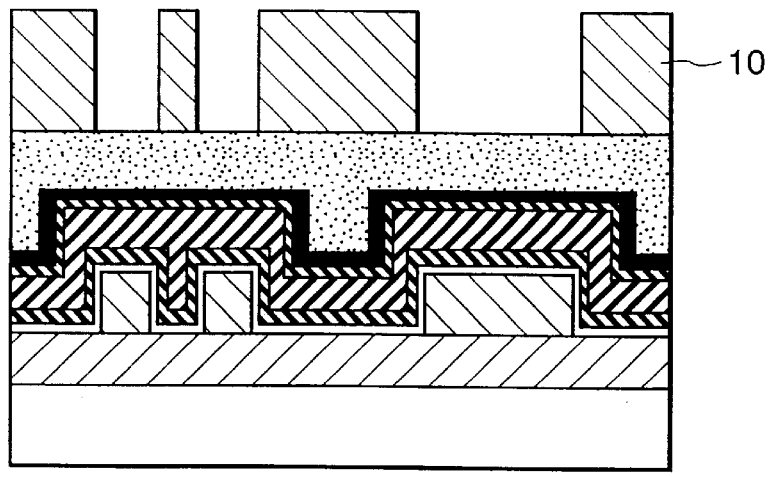
Figure 11J:
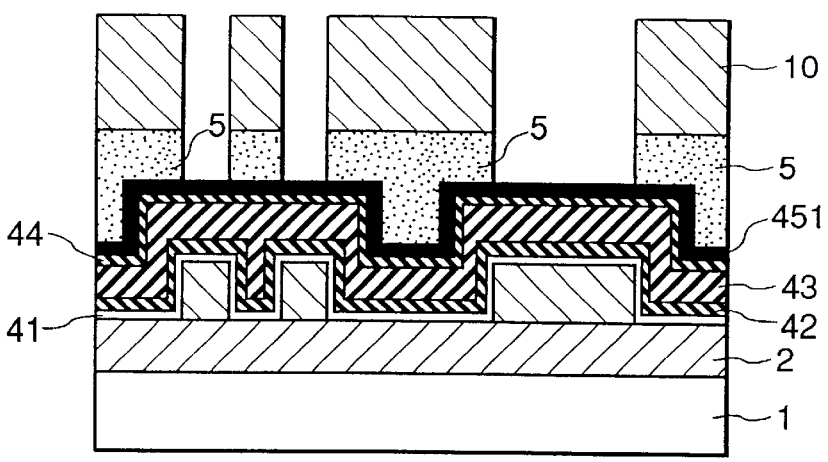
FIGS. 11(j) to 11(l) are sectional views of major manufacturing steps of the manufacturing process successive to FIG. 10(i) in which the multilayer wiring structure of the present invention is formed.
Figure 11K:
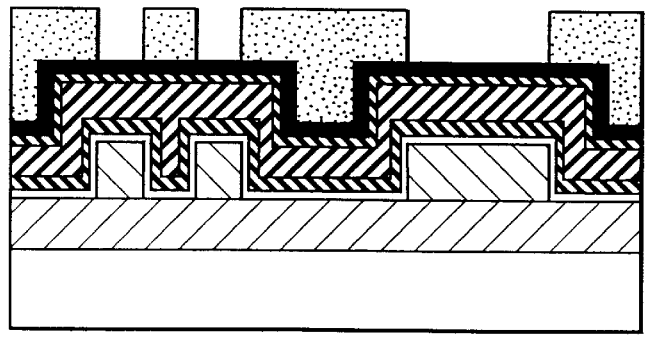
Figure 11L:
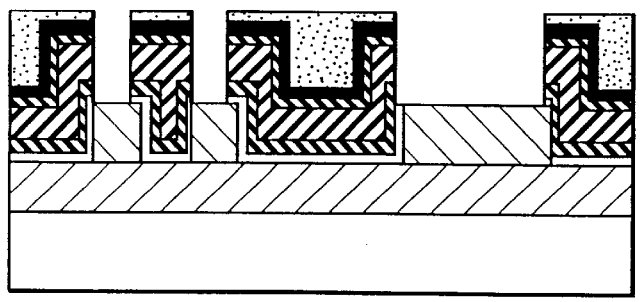
Figure 12:
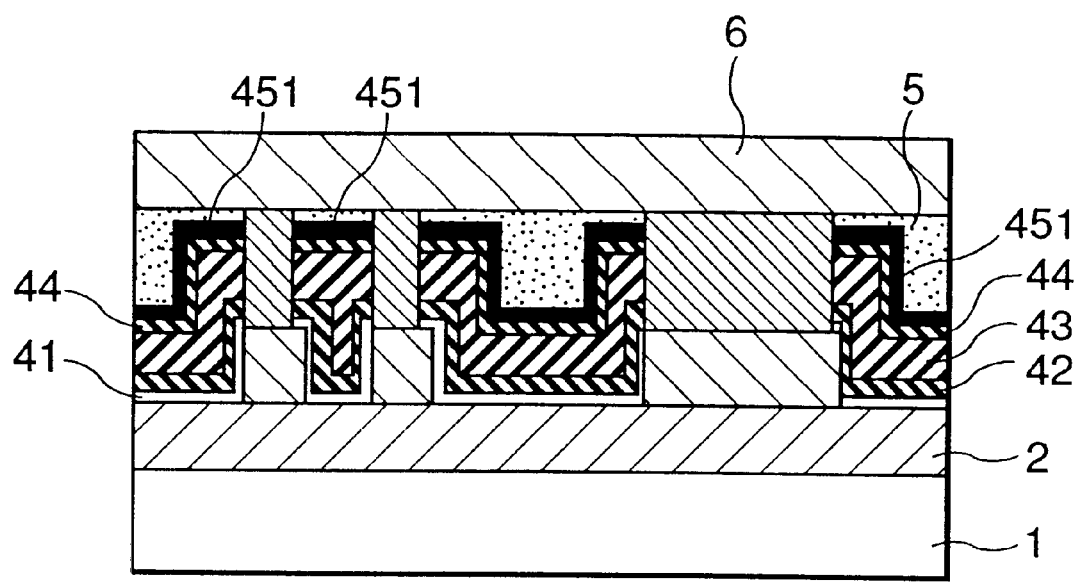
FIG. 12 is a sectional view of a major manufacturing step of the manufacturing process successive to FIG. 11(l) in which the multilayer wiring structure of the present invention is formed.

A sectional view of the structure obtained herein is shown in FIG. 7. FIGS. 8 through 12 show the manufacturing process for this embodiment. However, since many aspects do not differ from the first embodiment, a description is given on the aspects which are changed.

The first embodiment described above shows a low dielectric constant inter-layer insulating film 4 consisting of a silicon excess layer 41, a DLC film 42, an amorphous carbon fluoride film 43, a DLC film 44, and a silicon excess layer 45. Although, in that case, it is assumed that the silicon excess layer 45 is a silicon oxide film, this embodiment uses a silicon nitride film 45 with a thickness of about 100 nm instead of the silicon oxide film (FIG. 9(e)). That is, the only difference from the first embodiment is to use the silicon nitride film 451. A conventional plasma CVD process with nitrogen ($N_2$) and $SiH_4$ gas as the material, is used for forming the silicon nitride film 451. In this case, the silicon nitride film 451 is formed under the conditions which provide excess silicon. The film formation conditions can be attained in such a manner that at least the supply ratio of $N_2$ and $SiH_4$ gas is arranged to exceed 3:2 when a high density plasma device at low vacuum, as shown in FIG. 6, is used. The supply ratio of 3:2 means that the ratio of the number of Si atoms to the number of $N_4$ atoms is 3: 4, and indicates that the material supply ratio determines the primary stoichiometric ratio of the resultant silicon nitride film $Si_3N_4$.

Making silicon excess also forms an interface transition layer with the DLC film, and significantly enhances adhesion. This silicon nitride film 451 was also formed at a deposition temperature of 200° C. or less. FIGS. 8 through 12 show sectional views for the process of the second embodiment. However, the process, up to form a resist mask for via hole through flattening (FIG. 10(i)), is exactly same as in the first embodiment. In the second embodiment, thereafter, when silicon oxide, which is a flattened film at the via hole region, is etched, it is etched until the silicon nitride film 451 (FIG. 11(j)), instead of once interrupting the etching in silicon oxide. In this case, the silicon nitride film 451 has higher etching resistance to the material gas $CF_4$, for dry etching silicon oxide, than silicon oxide, and serves as an etching stopper, thus, the flattened film at the via hole region can be surely removed. Thereafter, after the resist is ashed, the silicon nitride film 451 is etched off by dry etching. In this case, the entire silicon oxide film as the flattened insulating film 5 is etched simultaneously as the silicon nitride film 451 with etching resistance is etched. This thins the flattened insulating film 5, so that it is effective to lower the effective dielectric constant for all inter-layer insulating films. As in the first embodiment, the DLC film, amorphous carbon fluoride film, DLC film, and silicon excess layer are etched to form a via hole, and a via plug such as tungsten is buried to form the second wiring layer. That is, the silicon nitride film 451 with excess silicon serves two roles, in enhancement of adhesion and as the etching stopper.

Third Embodiment of the Invention

Figure 19:
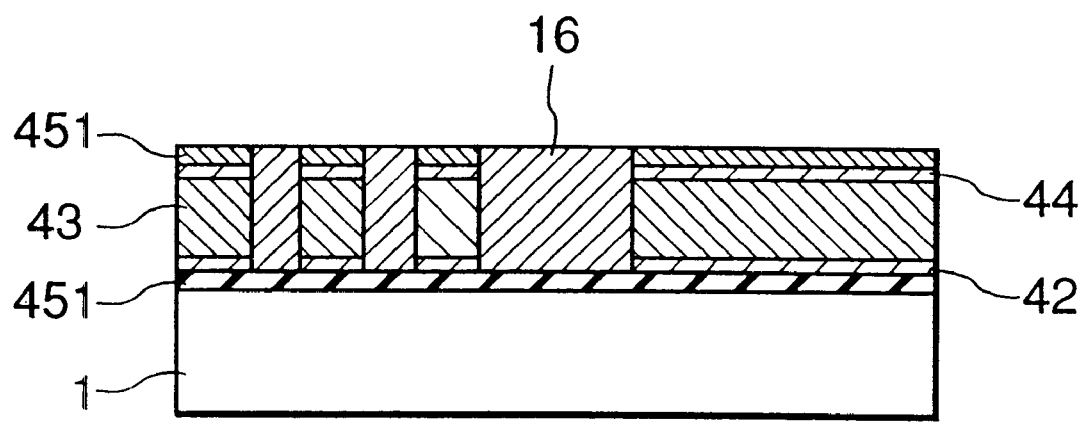
FIG. 19 is a sectional view of a completed multilayer obtained by a third embodiment of the present invention.
Figure 20A:
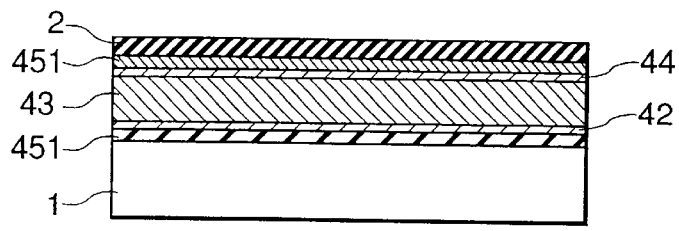
FIGS. 20(a) to 20(d) are sectional views of major manufacturing steps in which the multilayer wiring structure obtained by the third embodiment of the present invention is formed.
Figure 20B:
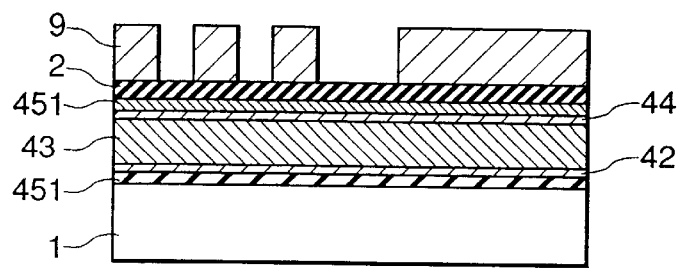
Figure 20C:
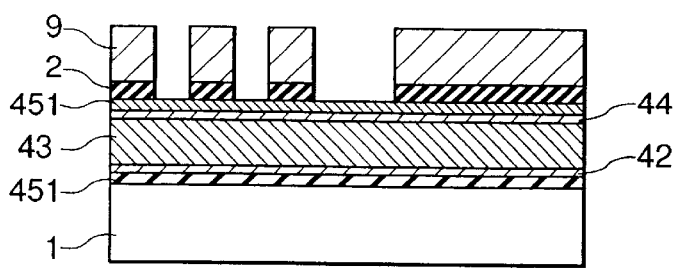
Figure 20D:
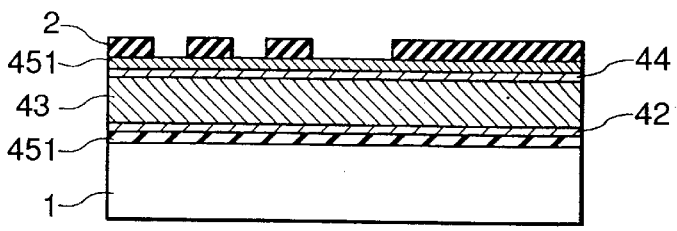

The structure obtained by this embodiment is shown in FIG. 19. FIGS. 18 and 17 show its manufacturing process. Since the film formation conditions for the inter-layer film do not much differ from the second embodiment, description is given on the aspects which differ.

Here, there is shown a low dielectric constant inter-layer film 4 consisting of a silicon nitride film 451, a DLC film 42, an amorphous carbon fluoride film 43, a DLC film 44, a silicon nitride film 451 and silicon oxide 5 as in the second embodiment. Subsequently, the silicon oxide is etched until the silicon nitride film is exposed by using the lithography technology and the dry etching technology with a wiring pattern, instead of a via pattern in the second embodiment. After the resist is removed, the silicon nitride film is etched. Subsequently, as in the first embodiment, etching is performed on the DLC film 44, the amorphous carbon fluoride film 43, and the DLC film 42 to form the wiring pattern. During this time, the silicon nitride film 451 serves as a stopper. Then, a flattened copper wiring 16 can be formed by performing CMP after film forming copper as the wiring material. Next, a three-layer wiring can be implemented by converting the lithography pattern into a via pattern and repeating the steps of wiring and via formation five times.

Figure 25:
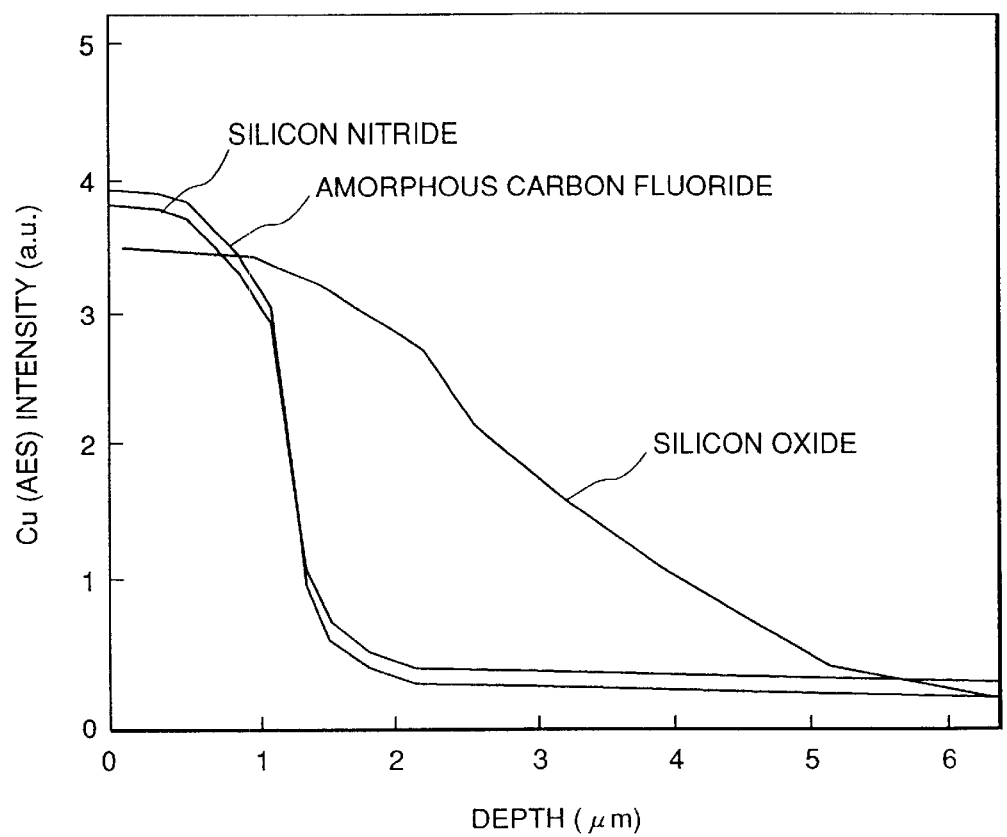
FIG. 25 is a graph showing depth dependency of AES strength of copper.

This embodiment is a wiring or via structure which uses an inter-layer film with an amorphous carbon fluoride film coated by a silicon nitride film, in which the copper, used as the wiring material, directly contacts the inter-layer film, and which does not have a problem of metal corrosion at the via region. FIG. 25 shows a result of evaluation on diffusion of copper that is heat treated for about one hour in a nitrogen atmosphere at 400° C. by the auger electron spectroscopy (hereinafter abbreviated to AES). Copper signals have a steep transition region on the silicon nitride film or the amorphous carbon fluoride film. This means that copper does not diffuse into the silicon nitride film and the amorphous carbon fluoride film.

Fourth Embodiment of the Invention

Figure 21E:
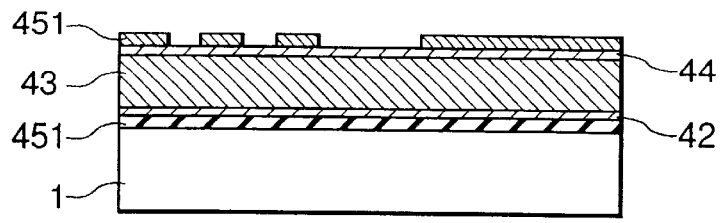
FIGS. 21(e) to 21(g) are sectional views of major manufacturing steps successive to FIG. 20(d) in which the multilayer wiring structure obtained by the third embodiment of the present invention is formed.
Figure 21F:
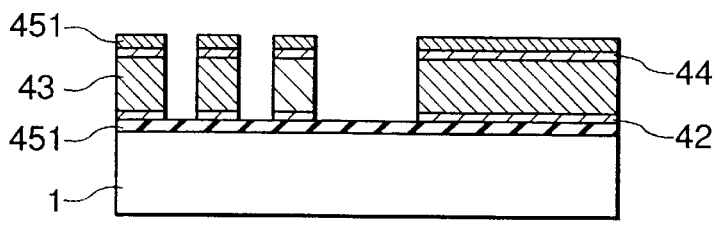
Figure 21G:
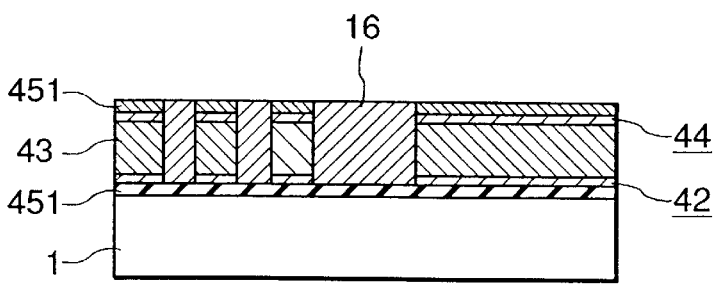
Figure 22:
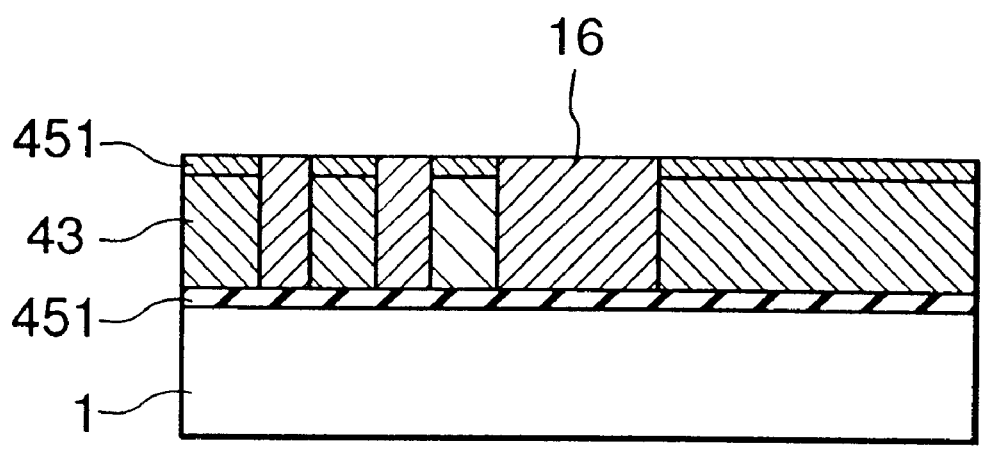
FIG. 22 is a sectional view of a completed multilayer wiring structure obtained by the third embodiment of the present invention.
Figure 23A:
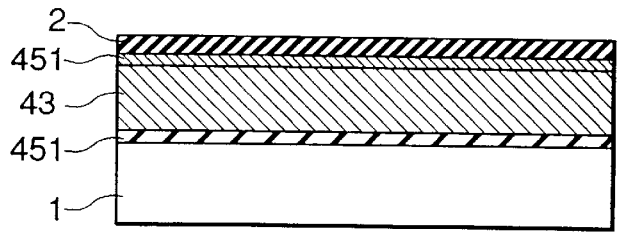
FIGS. 23(a) to 23(d) are sectional views of major manufacturing steps in which the multilayer wiring structure obtained by the fourth embodiment of the present invention is formed.
Figure 23B:
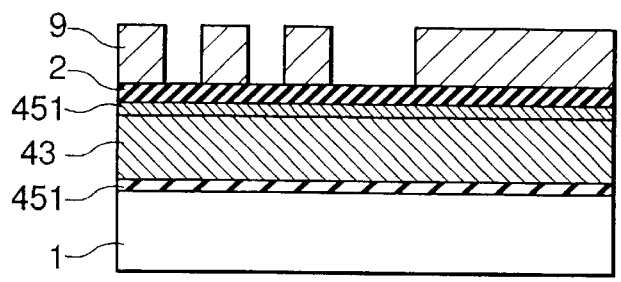
Figure 23C:
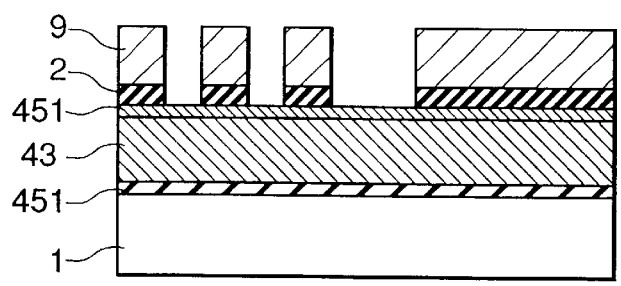
Figure 23D:
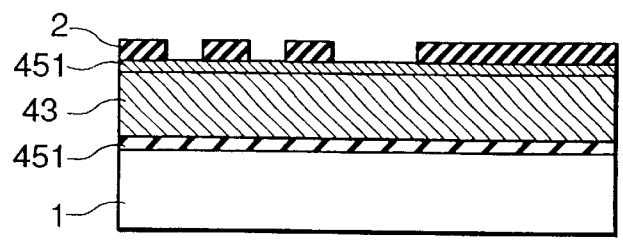
Figure 24E:
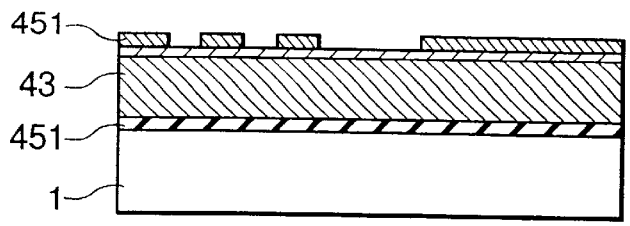
FIGS. 24(e) to 24(g) are sectional views of major manufacturing steps successive to FIG. 23(d) in which the multilayer wiring structure obtained by the fourth embodiment of the present invention is formed.
Figure 24F:
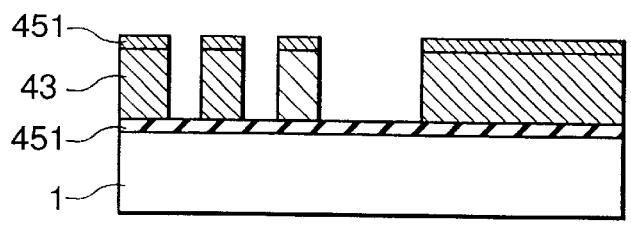
Figure 24G:
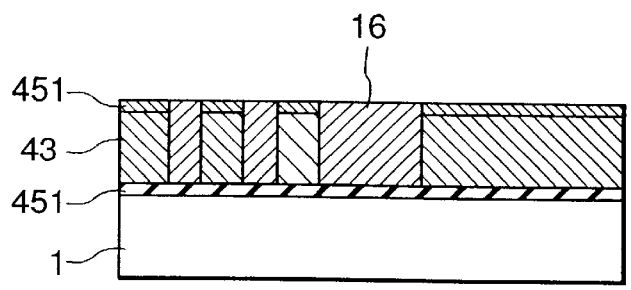

The structure obtained by this embodiment is shown in FIG. 22. FIGS. 20 and 21 show its manufacturing process. Since the film formation conditions for the inter-layer film do not differ much from the third embodiment, description is given on the aspects which differ. This embodiment is a case where the DLC film is omitted when the silicon nitride film 451 is used. It is understood that, since oxygen gas is not used in forming the silicon nitride film 451, the amorphous carbon fluoride film 43 is not significantly damaged. This structure has an advantage that the film formation time can be shortened because the inter-layer film has a simple structure.

Here, a low dielectric constant inter-layer film 4 is shown, consisting of a silicon nitride film 451, an amorphous carbon fluoride film 43, a silicon nitride film 451 and silicon oxide as in the third embodiment. The patterning step after this film formation step is, as in the third embodiment, to etch silicon oxide with the wiring pattern until the silicon nitride film is exposed by using the lithography technology and the dry etching technology, and to etch the silicon nitride film 451 after the resist is removed. Thereafter, as in the first embodiment, the amorphous carbon fluoride film 43 is etched to form the wiring pattern. At the moment, the silicon nitride film 451 serves as a stopper. Next, a flattened copper wiring 16 can be formed by performing CMP after film forming copper as the wiring material. A three-layer wiring can be implemented by converting the lithography pattern into a via pattern and repeating the steps of wiring and via formation five times.

Supplemental Description

Although the rise of the dielectric constant of the inter-layer insulating film may be a concern because the present invention inserts a silicon oxide film or the like into the inter-layer film, there is little reason, from the following, to hesitate inserting an insulating film with high dielectric constant to enhance the adhesion. For example, if an insulating film with a thickness d1 and dielectric constant $\epsilon 1$ is laminated on an insulating film with a thickness d2 and dielectric constant $\epsilon 2$, its effective dielectric constant $\epsilon T$ is measured from the capacity by forming electrodes on both sides of the laminated film and is expressed as follows:

$$\epsilon T = \epsilon 1 \epsilon 2 (d1+d2)/(\epsilon 1 d2 + \epsilon 2 d1)$$

For example, even if d1=2, when a laminated structure is assumed to consist of an amorphous carbon fluoride film with specific dielectric constant $\epsilon 1=2.1$ and a silicon oxide film with specific dielectric constant $\epsilon 2=3.9$, the equivalent dielectric constant is $\epsilon T=2.73$. If d1=2d2 for the above combination, $\epsilon T=2.48$. Thus, a low dielectric constant is sufficiently attained for an inter-layer insulating film.

While the embodiments have been described for a case where wiring or a conductive plug is of a tungsten type, it is a matter of course that polycrystal silicon or conventional conductive materials, such as aluminum or copper, may be used. In addition, it is also effective to use technology which is employed for providing a titanium or titanium nitride layer on the under layer of these conductive materials to enhance adhesion of the conductive material to the insulating layer. In addition, the silicon oxide film in the embodiment may be replaced with a silicon nitride film. The silicon oxide film, silicon nitride film, and silicon oxi-nitride film may be replaced each other. In any case, the advantages of the present invention are not deteriorated.

While the embodiments used 13.56 MHz and 400 kHz as the frequencies for the plasma high frequency source and the bias high frequency source, respectively, they are typical for such plasma equipment, and used because the power supply is readily available. Therefore, the present invention is not particularly limited to such frequencies. However, if the frequencies are changed for the plasma high frequency source and the bias high frequency source, some changes may be necessary for the design requirements for film formation and etching conditions.

As described in the Summary of the Invention, the amorphous carbon fluoride film has low dielectric constant, and, although it is highly expected as a material for inter-layer insulating film, it has poor adhesion with another material, and is difficult to apply to an actual process. However, the adhesion is significantly enhanced, and the problem of various films is completely eliminated by disposing a DLC film containing a silicon excess silicon oxide film, oxi-nitride film, or silicon nitride film and a suitable amount of hydrogen on a surface contacting another material (metal material, semiconductor material, or insulating material).

Furthermore, when an uneven surface is provided with an amorphous carbon fluoride film, which is enhanced for adhesion by the silicon excess film and the DLC film, and laminated with a silicon oxide film, an oxi-nitride film, or silicon nitride film, and then polished for its upper film, flattening can be easily attained by the current technology. In addition, when the flattened layer, thus flattened itself, is etched by a selective etching mask consisting of positive resist, and applied as a hard mask for selective etching of the underlying DLC film and amorphous carbon fluoride film, then oxygen plasma etching can be easily applied. In this case, if bias applying high frequency is applied to electrodes for disposing the sample to be etched, anisotropic etching can be performed so that selective etching is performed with little side etching and accurately follows the shape. An advantage provided by the flattened film serving also as a hard mask, has an effect to prevent exposure of a material containing carbon and fluorine, which are dissimilar materials in the LSI process, to the surface of wafer. That is, when a wafer is passed through the current process line, there is no possibility that the current line is contaminated by carbon or fluorine, except for the time when a via plug is buried.

Therefore, when wiring layers which are electrically isolated and disposed by an insulating layer containing an amorphous carbon fluoride layer, with carbon and fluorine as main components, is formed with a hole extending through the amorphous carbon fluoride film according to the design, and electrically connected by burying a conductive material therein, a semiconductor device is first completed. This semiconductor device has a low stray capacity between the layers, and wherein interconnecting delay and crosstalk are eliminated even in a semiconductor integrated circuit with wiring width of about 0.5 $\mu$m. If the wiring having the same wiring geometry is assumed, the interconnecting delay may be reduced by about one half when compared with the case of silicon oxide film.

Hence, an LSI process with stability and high degree of freedom is completed on an actual process level by introducing a new low dielectric constant inter-layer insulating film, so that a fast semiconductor device with excellent noise characteristics is realized.

The amorphous carbon fluoride film coated with the DLC film has not only low dielectric constant, but also very high strength on its surface, so that it may be used for coating strip wiring of various electronic equipment or the like.

What is claimed is:

1. A method for manufacturing a semiconductor device comprising an inter-layer film which is directly in contact with a copper based wiring, said inter-layer film being an amorphous carbon fluoride film coated with a silicon nitride film and a diamond like carbon film, said method comprising the steps of:

forming an amorphous carbon fluoride film;

forming a diamond like carbon film and a silicon nitride film after said amorphous carbon fluoride film is formed;

forming a silicon oxide film on said diamond like carbon film and silicon nitride film;

forming a wiring or via region in said silicon oxide film using a patterned photoresist;

etching said silicon nitride film after removing said photoresist;

forming a wiring pattern in said amorphous carbon fluoride film with a mask of said silicon nitride film; and forming flattened copper in said wiring or via region.

2. A semiconductor device comprising an inter-layer film which is directly in contact with a copper based wiring, said inter-layer film being an amorphous carbon fluoride film coated on its both sides with a silicon nitride film containing excess silicon, wherein said silicon nitride prevents fluorine in the amorphous carbon fluoride film from being emitted.

3. A method for manufacturing a semiconductor device comprising an inter-layer film which is directly in contact with a copper based wiring, said inter-layer film being an amorphous carbon fluoride film coated with a silicon nitride film, said method comprising the steps of:

forming an amorphous carbon fluoride film;

forming a silicon nitride film after forming said amorphous carbon fluoride film;

forming a silicon oxide film on said silicon nitride film;

forming a wiring or via region in said silicon oxide film by using a patterned photoresist;

etching said silicon nitride film after removing said photoresist;

forming a wiring pattern on said amorphous carbon fluoride film using said silicon nitride film as a mask; and forming flattened copper in said wiring or via region.

* * * * *